(12) United States Patent
Yueksel et al.

(10) Patent No.: US 11,914,678 B2
(45) Date of Patent: Feb. 27, 2024

(54) INPUT ENCODING FOR CLASSIFIER GENERALIZATION

(71) Applicant: International Business Machines Corporation, Armonk, NY (US)

(72) Inventors: Hazar Yueksel, New York, NY (US); Kush Raj Varshney, Ossining, NY (US); Brian E. D. Kingsbury, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 821 days.

(21) Appl. No.: 17/030,156

(22) Filed: Sep. 23, 2020

(65) Prior Publication Data

US 2022/0092365 A1 Mar. 24, 2022

(51) Int. Cl.
*G06F 18/241* (2023.01)
*G06N 3/08* (2023.01)
*H03M 7/30* (2006.01)

(52) U.S. Cl.
CPC ............. *G06F 18/241* (2023.01); *G06N 3/08* (2013.01); *H03M 7/3062* (2013.01); *H03M 7/3066* (2013.01); *H03M 7/6011* (2013.01)

(58) Field of Classification Search
CPC ...... G06F 18/241; G06N 3/08; H03M 7/3062; H03M 7/3066; H03M 7/6011
See application file for complete search history.

(56) References Cited

U.S. PATENT DOCUMENTS

| 10,176,802 B1 | 1/2019 | Ladhak et al. |
| 10,210,862 B1 | 2/2019 | Ladhak et al. |

(Continued)

FOREIGN PATENT DOCUMENTS

| CN | 106250986 | 12/2016 |
| CN | 110633806 A | 12/2019 |

(Continued)

OTHER PUBLICATIONS

Du Y, Xu J, Xiong H, Qiu Q, Zhen X, Snoek CG, Shao L. Learning to Learn with Variational Information Bottleneck for Domain Generalization. arXiv preprint arXiv:2007.07645. Jul. 15, 2020. (Year: 2020).*

(Continued)

*Primary Examiner* — Eric Nilsson
(74) *Attorney, Agent, or Firm* — Daniel J Blabolil

(57) ABSTRACT

Techniques for classifier generalization in a supervised learning process using input encoding are provided. In one aspect, a method for classification generalization includes: encoding original input features from at least one input sample $\vec{x}_S$ with a uniquely decodable code using an encoder $E(\bullet)$ to produce encoded input features $E(\vec{x}_S)$, wherein the at least one input sample $\vec{x}_S$ comprises uncoded input features; feeding the uncoded input features and the encoded input features $E(\vec{x}_S)$ to a base model to build an encoded model; and learning a classification function $\tilde{C}_E(\bullet)$ using the encoded model, wherein the classification function $\tilde{C}_E(\bullet)$ learned using the encoded model is more general than that learned using the uncoded input features alone.

14 Claims, 11 Drawing Sheets

(56) References Cited

U.S. PATENT DOCUMENTS

| | | | |
|---|---|---|---|
| 10,373,612 | B2 | 8/2019 | Parthasarathi et al. |
| 10,657,461 | B2 | 5/2020 | McMahan et al. |
| 10,706,351 | B2 | 7/2020 | Rainwater |
| 2020/0027033 | A1 | 1/2020 | Garg |
| 2022/0343218 | A1 | 10/2022 | Yueksel |

FOREIGN PATENT DOCUMENTS

| | | |
|---|---|---|
| CN | 112347754 | 2/2021 |
| WO | WO2020029590 A1 | 2/2020 |

OTHER PUBLICATIONS

Badrinarayanan, Vijay, Alex Kendall, and Roberto Cipolla. "Segnet: A deep convolutional encoder-decoder architecture for image segmentation." IEEE transactions on pattern analysis and machine intelligence 39.12 (2017): 2481-2495. (Year: 2017).*

Hazar Yueksel, Kush R. Varshney, Brian Kingsbury, "A Kolmogorov Complexity Approach to Generalization in Deep Learning," ICLR 2020 Conference Blind Submission, publicly available Sep. 25, 2019 (16 pages)—Grace Period Disclosure.

Hazar Yueksel, Kush R. Varshney, Brian Kingsbury, "A Kolmogorov Complexity Approach to Generalization in Deep Learning," ICLR 2020 Conference Blind Submission, publicly available Nov. 13, 2019 (19 pages)—Grace Period Disclosure.

Hazar Yueksel, Kush R. Varshney, Brian Kingsbury, "A Kolmogorov Complexity Approach to Generalization in Deep Learning," ICLR 2020 Conference Blind Submission, publicly available Nov. 15, 2019 (19 pages)—Grace Period Disclosure.

H. Wen et al., "Neural Encoding and Decoding with Deep Learning for Dynamic Natural Vision," 2018 (27 pages).

S. Minaee et al., "Deep Learning Based Text Classification: A Comprehensive Review" arXiv:2004.03705v1 Apr. 2020 (42 pages).

Md Zahangir Alom et al., "A State-of-the-Art Survey on Deep Learning Theory and Architectures," Electronics, 8, 292 Mar. 2019 (67 pages).

Disclosed Anonymously, "Reinforcement Learning for Fuzzy Testing Techniques," IPCOM000252021D (Dec. 13, 2017) (36 pages).

Disclosed Anonymously, "Machine Learning for Hardware Simulation," IPCOM000251992D (Dec. 13, 2017) (33 pages).

List of IBM Patents or Applications Treated as Related, May 19, 2021 (2 pages).

Mell et al., "The NIST Definition of Cloud Computing," NIST Special Publication 800-145, Sep. 2011 (7 pages).

N. Bouacida et al., "Adaptive Federated Dropout: Improving Communication Efficiency and Generalization for Federated Learning," arXiv preprint arXiv:2011.04050v1 (Nov. 2020) (9 pages).

F. Sattler et al., "Robust and Communication-Efficient Federated Learning from Non-IID Data," arXiv preprint arXiv:1903.02891v1 (Mar. 2019) (17 pages).

K. Pillutla et al., "Robust Aggregation for Federated Learning," arXiv preprint arXiv:1912.13445v1 (Dec. 2019) (38 pages).

W. Zhang et al., "Dynamic Fusion-Based Federated Learning for COVID-19 Detection," arXiv preprint arXiv:2009.10401v4 (Oct. 2020) (9 pages).

D. Preuveneers et al., "Chained Anomaly Detection Models for Federated Learning: An Intrusion Detection Case Study," Applied Sciences, 8(12), 2663 (21 pages) (Dec. 2018).

L. Le et al., "Supervised autoencoders: Improving generalization performance with unsupervised regularizers," 32nd Conference on Neural Information Processing Systems (NeurIPS 2018) (Dec. 2018) (11 pages).

Bennett et al., "Information Distance," IEEE Transactions on Information Theory, vol. 44, No. 4, pp. 1407-1423 (Jul. 1998).

Cilibrasi et al., "Clustering by Compression," IEEE Transactions on Information Theory, vol. 51, No. 4 (Apr. 2005) (21 pages).

A. Kurakin et al., "Adversarial Machine Learning at Scale," International Conference on Learning Representations (Feb. 2017) (17 pages).

A. Madry et al., "Towards Deep Learning Models Resistant to Adversarial Attacks," arXiv:1706.06083v4 (Sep. 2019) (28 pages).

E. Wong et al., "Scaling provable adversarial defenses," arXiv:1805.12514v2 (Nov. 2018) (22 pages).

H. Zhang et al., "Theoretically Principled Trade-off between Robustness and Accuracy," arXiv:1901.08573v3 (Jun. 2019) (31 pages).

G. Ungerboeck, "Channel Coding with Multilevel/Phase Signals," IEEE Transactions on Information Theory, vol. 28, No. 1, pp. 56-67 (Jan. 1982).

M. Hatamian et al., "Design Considerations for Gigabit Ethernet 1000Base-T Twisted Pair Transceivers," IEEE Custom Integrated Circuits Conference, pp. 335-342 (May 1998).

C. Zhang et al., "Understanding Deep Learning Requires Rethinking Generalization," International Conference on Learning Representations (Feb. 2017) (15 pages).

D. Hendrycks et al., "Benchmarking Neural Network Robustness to Common Corruptions and Perturbations," International Conference on Learning Representations (Mar. 2019) (16 pages).

Alom, et al., "A State-of-the-Art Survey on Deep Learning Theory and Architectures," Electronics [journal], 2019, 67 pages, vol. 8, No. 3, Article 292, DOI: 10.3390/electronics8030292, Retrieved from the Internet: <URL: https://www.mdpi.com/2079-9292/8/3/292>.

Bouacida, et al. "Adaptive Federated Dropout: Improving Communication Efficiency and Generalization for Federated Learning," Association for the Advancement of Artificial Intelligence, Nov. 8, 2020, 9 pages, arXiv:2011.04050v1, DOI: 10.48550/arXiv.2011.04050, Retrieved from the Internet: <URL: https://arxiv.org/abs/2011.04050>.

International Searching Authority, "Notification of Transmittal of the International Search Report and the Written Opinion of the International Searching Authority, or Declaration," Patent Cooperation Treaty, dated Jul. 19, 2022, 11 pages, International Application No. PCT/CN2022/088727.

Disclosed Anonymously, "Machine Learning for Hardware Simulation," IP.com, Dec. 13, 2017, 33 pages, IP.com No. IPCOM000251992D, Retrieved from the Internet: <URL: https://priorart.ip.com/IPCOM/000251992>.

Disclosed Anonymously, "Reinforcement Learning for Fuzzing Testing Techniques," IP.com, Dec. 13, 2017, 36 pages, IP.com No. IPCOM000252021D, Retrieved from the Internet: <URL: https://priorart.ip.com/IPCOM/000252021>.

Le, et al., "Supervised autoencoders: Improving generalization performance with unsupervised regularizers," Advances in Neural Information Processing Systems, 2018, 11 pages, vol. 31, Retrieved from the Internet: <URL: https://proceedings.neurips.cc/paper/2018/hash/2a38a4a9316c49e5a833517c45d31070-Abstract.html>.

Minaee, et al., "Deep Learning Based Text Classification: A Comprehensive Review," CoRR [journal], Apr. 6, 2020, 42 pages, vol. abs/2004.03705, arXiv:2004.03705v1, Retrieved from the Internet: <URL: https://arxiv.org/abs/2004.03705>.

Pillutla, et al., "Robust Aggregation for Federated Learning," IEEE Transactions on Signal Processing [journal], Dec. 31, 2019, 38 pages, vol. 70, DOI: 10.1109/tsp.2022.3153135, Retrieved from the Internet: <URL: https://arxiv.org/abs/1912.13445>.

Preuveneers, et al., "Chained Anomaly Detection Models for Federated Learning: An Intrusion Detection Case Study," Applied Sciences [journal], 21 pages, vol. 8, No. 12, Article 2663, DOI: 10.3390/app8122663, Retrieved from the Internet: <URL: https://www.mdpi.com/2076-3417/8/12/2663>.

Sattler, et al., "Robust and Communication-Efficient Federated Learning from Non-IID Data," CoRR [journal], Mar. 7, 2019, 17 pages, vol. abs/1903.02891, arXiv:1903.02891v1, Retrieved from the Internet: <URL: https://arxiv.org/abs/1903.02891>.

Wen, et al., "Neural Encoding and Decoding with Deep Learning for Dynamic Natural Vision," Cerebral Cortex [journal], 27 pages, vol. 28, No. 12, DOI: 10.1093/cercor/bhx268, Retrieved from the Internet: <URL: https://academic.oup.com/cercor/article/28/12/4136/4560155>.

(56) References Cited

OTHER PUBLICATIONS

Zhang, et al., "Dynamic Fusion based Federated Learning for COVID-19 Detection," Dynamic Fusion-based Federated Learning for COVID-19 Detection [journal], CoRR, Oct. 26, 2020, 9 pages, vol. abs/2009.10401, arXiv:2009.10401v4, Retrieved from the Internet: <URL: https://arxiv.org/abs/2009.10401>.

IBM: List of IBM Patents or Patent Applications Treated as Related (Appendix P), Dec. 6, 2023, 2 pages.

Yueksel, et al., "Input-Encoding with Federated Learning," Application and Drawings, Filed on Apr. 24, 2022, 44 Pages, Related JP Patent Application Serial No. 2023-560054.

* cited by examiner

| Method | $A_{test}$ | $A_{infer}^{(GN)}$ | $A_{infer}^{(SN)}$ | $A_{infer}^{(IN)}$ |
|---|---|---|---|---|
| RPO | 95.70% | 25.00% | 32.70% | 21.90% |
| JT | 91.90% | 50.60% | 54.70% | 46.60% |
| TTT | 92.10% | 54.40% | 58.20% | 50.00% |
| TTTO | 91.80% | 74.20% | 77.40% | 69.40% |
| ALP | 83.50% | 77.30% | 77.10% | 71.70% |
| CE | 90.19% | 75.22% | 77.58% | 60.18% |

GN: Gaussian noise; SN: shot noise; IN: impulse noise; RPO: replacing pool operator; JT: joint training; TTT: test-time training; TTTO: test-time training online; ALP: adversarial logit pairing; CE: channel encoding as per the present techniques.

| Model | AT? | $A_{test}$ | $A_{infer}$ |
|---|---|---|---|
| A | Yes | 85.25% | 45.89% |
| B | Yes | 87.30% | 47.04% |
| C | Yes | 27.07% | 23.54% |
| D | Yes | 84.92% | 56.61% |
| CE-2 | No | 85.71% | 34.36% |
| CE-32 | No | 87.38% | 30.19% |

AT: adversarial training; CE-2: with 2 channel encodings; CE-32: with 32 channel encodings.

INPUT ENCODING FOR CLASSIFIER GENERALIZATION

STATEMENT REGARDING PRIOR DISCLOSURES BY THE INVENTOR OR A JOINT INVENTOR

The following disclosure(s) are submitted under 35 U.S.C. 102(b)(1)(A):

DISCLOSURE(S)

"A Kolmogorov Complexity Approach to Generalization in Deep Learning," Hazar Yueksel, Kush R. Varshney, Brian Kingsbury, ICLR 2020 Conference Blind Submission, publicly available Sep. 25, 2019 (16 pages).

"A Kolmogorov Complexity Approach to Generalization in Deep Learning," Hazar Yueksel, Kush R. Varshney, Brian Kingsbury, ICLR 2020 Conference Blind Submission, publicly available Nov. 13, 2019 (19 pages).

"A Kolmogorov Complexity Approach to Generalization in Deep Learning," Hazar Yueksel, Kush R. Varshney, Brian Kingsbury, ICLR 2020 Conference Blind Submission, publicly available Nov. 15, 2019 (19 pages).

FIELD OF THE INVENTION

The present invention relates to supervised learning processes, and more particularly, to techniques for classifier generalization in a supervised learning process using input encoding.

BACKGROUND OF THE INVENTION

In machine learning, generalization refers to how well a trained model performs on previously unseen inputs. Previously unseen inputs are data other than that data on which the model was trained.

Conventional approaches to generalization are largely concerned with minimizing the difference between training and test errors measured on identically distributed training and test sets. With conventional approaches, the generalization error is defined as the difference between the training error measured on the training set and test error measured on the test set. However, this traditional approach fails to take into account how representative these sets are of the empirical sample set from which real-world input samples, which may be corrupted by noise or adversarially perturbed, are drawn during inference. For instance, when the training and test sets are not sufficiently representative of the empirical sample set, the difference between training and inference errors can be significant, rendering the learned classification function ineffective. Such a difference between training and inference errors can result in unreliable decisions in real-world applications, raising questions about how robust, fair and transparent a learned classification function is.

Techniques such as domain-generalization, domain-adaptation, and data-augmentation have been proposed to address this problem. For instance, domain-generalization attempts to better generalize to unknown domains by training on samples drawn from different domains. Domain-adaptation addresses the problem of generalization to a priori fixed target domains. Similar to domain-adaptation, adversarial training attempts to achieve robustness to adversarial perturbations by using training samples perturbed by a specific adversarial-perturbation method. Data-augmentation techniques perform simple label-preserving transformations of the training samples to provide a classifier with additional data points to learn from. All of these approaches present additional constraints to achieve generalization in a broader sense, i.e., to minimize the difference between training and inference errors.

Thus, to expand on this concept, techniques for classifier generalization that minimize the difference between training and inference errors in a real-world setting would be desirable.

SUMMARY OF THE INVENTION

The present invention provides techniques for classifier generalization in a supervised learning process using input encoding. In one aspect of the invention, a method for classification generalization is provided. The method includes: encoding original input features from at least one input sample $\vec{x}_S$ with a uniquely decodable code using an encoder $E(\cdot)$ to produce encoded input features $E(\vec{x}_S)$, wherein the at least one input sample $\vec{x}_S$ comprises uncoded input features; feeding the uncoded input features and the encoded input features $E(\vec{x}_S)$ to a base model to build an encoded model; and learning a classification function $\tilde{C}_E(\cdot)$ using the encoded model, wherein the classification function $\tilde{C}_E(\cdot)$ learned using the encoded model is more general than that learned using the uncoded input features alone.

A more complete understanding of the present invention, as well as further features and advantages of the present invention, will be obtained by reference to the following detailed description and drawings.

DETAILED DESCRIPTION OF PREFERRED EMBODIMENTS

Figure 1:
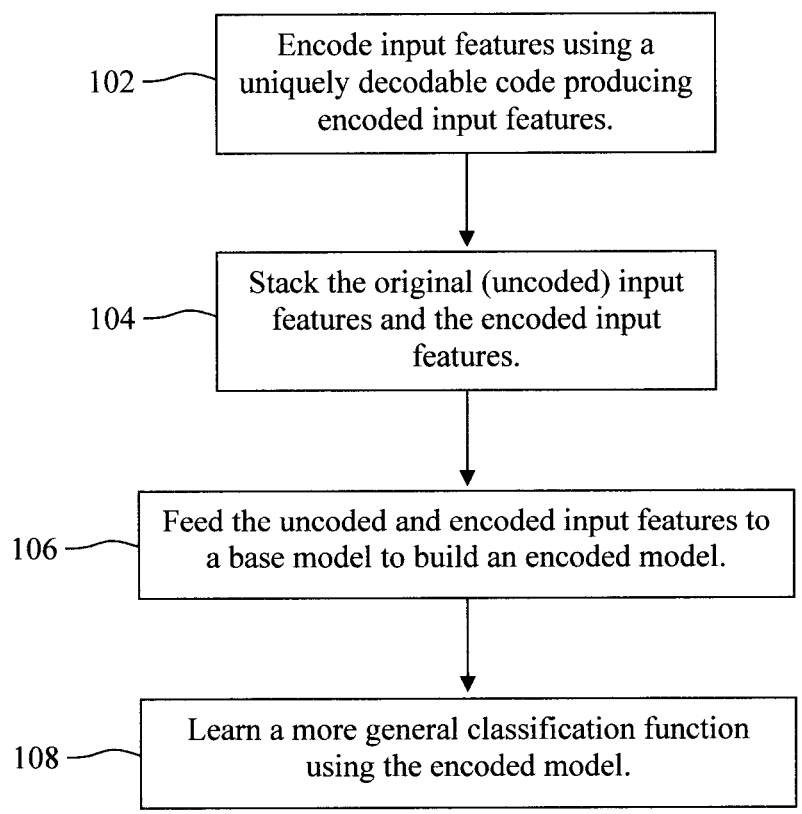
FIG. 1 is a diagram illustrating an exemplary methodology for classification generalization according to an embodiment of the present invention.

Provided herein are techniques for building an encoded model by encoding input samples with a uniquely decodable code in order to learn a classification function with increased generalization and thus robustness. Namely, the classification function learned by the present input-encoding techniques is more general than that learned by an uncoded model.

As will be described in detail below, the present techniques draw on algorithmic information theory which proposes a complexity measure, Kolmogorov complexity, as the absolute information content of any object, e.g., a computer program, function, or set. Based on Kolmogorov complexity, the normalized information distance discovers all effective similarities between a pair of objects, i.e., two objects that are close according to some effective similarity are also close according to the normalized information distance. See, for example, Bennett et al., "Information Distance," IEEE Transactions on Information Theory, vol. 44, no. 4, pp. 1407-1423 (July 1998) (hereinafter "Bennett"), the contents of which are incorporated by reference as if fully set forth herein. Thus, the normalized information distance is a universal cognitive similarity metric. After deriving a necessary and sufficient condition for generalization using the normalized information distance and formulating an optimization problem for generalization, coding theory is then employed to learn a more general classification function by extending the input features to a classifier with systematically generated encodings of the original features.

Notably, as a point of distinction from conventional approaches (see above), generalization error is defined herein as the difference between training and inference errors. Namely, minimizing the conventionally defined generalization error does not address the problem of generalizing to input samples drawn from an empirical sample set of which the training and test sets are not sufficiently representative. Furthermore, the present input-encoding techniques do not require training on samples drawn from different domains, as domain-generalization techniques do. As will be described in detail below, encoding the given training set enables a classifier to learn different relations between features that it could not learn from the uncoded training set alone. Moreover, the present input-encoding techniques do not require access to new samples from the target distribution during an adaptation phase, as domain-adaptation techniques do.

The present input-encoding techniques provide a computational advantage over adversarial training because input encodings can be generated only once before training, whereas adversarial training requires generating adversarially perturbed training samples in each epoch. Additionally, an adversarially trained classifier may not generalize well to samples subjected to an adversarial perturbation method different from the one used during training, which is a limitation that the present input-encoding techniques do not have.

The present input-encoding techniques are also distinguished from data-augmentation techniques because they do not require generating new samples to increase the diversity of the training set. Instead, a theoretically-grounded approach is taken to extend the input features with their encodings in order to enable a classifier to learn a sufficiently complex classification function from the set of available input samples.

The present input-encoding techniques provide the following contributions. For a classification task, there exists a target classification function that is a mapping between the input samples and their corresponding class. Given training and test sets, neither of which are sufficiently representative of the empirical sample set from which input samples are drawn during inference, a supervised learning algorithm is asked to find the target classification function. The techniques provided herein study how well the learned classification function generalizes with respect to the target classification function. In other words, they address problem of how to minimize the generalization error, which is defined herein as the difference between the training error and inference error measured on the empirical sample set, as opposed to the traditional definition, which is the difference between the training error and test error. Robustness to both common corruptions, e.g., Gaussian and shot noise, and adversarial perturbations, e.g., those found via projected gradient descent, is used to measure how well a learned classification function generalizes on the empirical sample set, which, unlike training and test sets, may typically contain corrupted or perturbed samples.

A key finding in algorithmic information theory is that the normalized information distance is a universal cognitive similarity metric, i.e., the normalized information distance between two objects minorizes any other admissible distance up to an additive logarithmic term. See Bennett. A necessary and sufficient condition for classifier generalization is derived herein based on the normalized information distance.

To apply tools from algorithmic information theory and coding theory to the problem of classifier generalization, a learning algorithm is formulated herein as a procedure for searching for a source code and it is shown that the learned classification function is a lossy compressor. Based on these theoretical findings, the normalized information distance between the target and learned source codes is used to derive a necessary and sufficient condition for generalization and formulate the problem of learning a more general source code as an optimization problem.

The normalized information distance provides the theoretical tools needed to learn more general source codes, but the normalized information distance is not effectively computable. Therefore, a compression-based similarity metric based on a real-world compressor is used to approximate this theoretical construct. See, for example, Cilibrasi et al., "Clustering by Compression," IEEE Transactions on Information Theory, vol. 51, no. 4, pp. 1523-1545 (April 2005), the contents of which are incorporated by reference as if fully set forth herein. Specifically, the normalized compression distance between the target source code and learned source code is used to derive an effectively computable condition on the compressed size of the learned source code to identify encodings of the input features that help to learn a more general source code.

To demonstrate the present techniques on a specific task, namely image classification, channel codes are used on the input features from an image dataset of training and test samples. Precisely, a four-dimensional (4-D) five-level pulse-amplitude modulation (5-PAM) trellis-coded modulation (TCM) scheme is used to systematically generate multiple encodings of the set of available input features. In doing so, the classifier is enabled to characterize information about relations between features in the empirical sample set that are not represented in the set of available input features. The generalization error is thereby reduced. These experiments with the image dataset of training and test samples show that a model, as a result of learning a more general classification function, trained on arbitrarily encoded input features is significantly more robust to common corruptions, such as Gaussian noise and shot noise, and to adversarial perturbations, like those generated via projected gradient descent (PGD), simultaneously.

Given the above overview, an exemplary method for classification generalization using the present input-encoding-based process is now described by way of reference methodology 100 of FIG. 1. As will be described in detail below, classification is a common machine learning task whereby a learning algorithm is asked to produce a classification function $f(\bullet): \mathbb{X} \to \mathbb{A}$, wherein $\mathbb{X}$ is an empirical sample set, and signal alphabet $\mathbb{A}$ is the set of classes u that are used for classification.

In step 102, input features of at least one input sample are encoded with a uniquely decodable code. Namely, each input sample is a collection of features, i.e., input features, that have been quantitively measured from some object or event. For instance, by way of example only, the features of a digital image are typically the value of the pixels in the digital image. Encoding of the input features in step 102 produces encoded input features.

An encoder is used to encode the input features. In general, an encoder is a function $E_f(\bullet)$ that converts the features in the input samples to a different representation. As will be described in conjunction with the description of FIG. 4 below, according to an exemplary embodiment the encoder first flattens the input features using a suitable flattening scheme. In this example, each input feature is represented by eight bits. The flattened features are then fed to a convolutional encoder, which produces one extra bit out of the two least significant bits of the eight bits representing each feature. A 4-D 5-PAM TCM symbol mapper then maps each of these nine bits into four equidistant 5-PAM symbols, which are then mapped to 12 bits by the bit mapper as a systematic way to generate multiple encodings of the input features. Each of the encodings has the same size as the original input features.

In terms of nomenclature, the original input features may also be referred to herein as 'uncoded input features' so as to contrast them from the encoded input features. In step 104, these uncoded input features and the encoded input features are stacked. Stacking commonly refers to a data structure containing a collection of objects, in this case uncoded and encoded input features.

In step 106, the (stacked) uncoded and encoded input features are fed to a base model to build an encoded model. According to an exemplary embodiment, the encoded model includes the encoder and the base model such that the inputs to the encoded model are the original (uncoded) input features. The base model has to have enough input channels to handle both the uncoded and encoded input features. Thus, the number of input channels of the base model may have to be increased. Notably, as will be described in detail below, it has been found that increasing the number of input channels alone confers no robustness to Gaussian noise.

Generally, the base model represents any type of supervised learning algorithm. One illustrative, non-limiting example of a supervised learning algorithm is a deep neural network. In machine learning and cognitive science, deep neural networks are a family of statistical learning models inspired by the biological neural networks of animals, and in particular the brain. Deep neural networks may be used to estimate or approximate systems and cognitive functions that depend on a large number of inputs and weights of the connections which are generally unknown.

Figure 2:
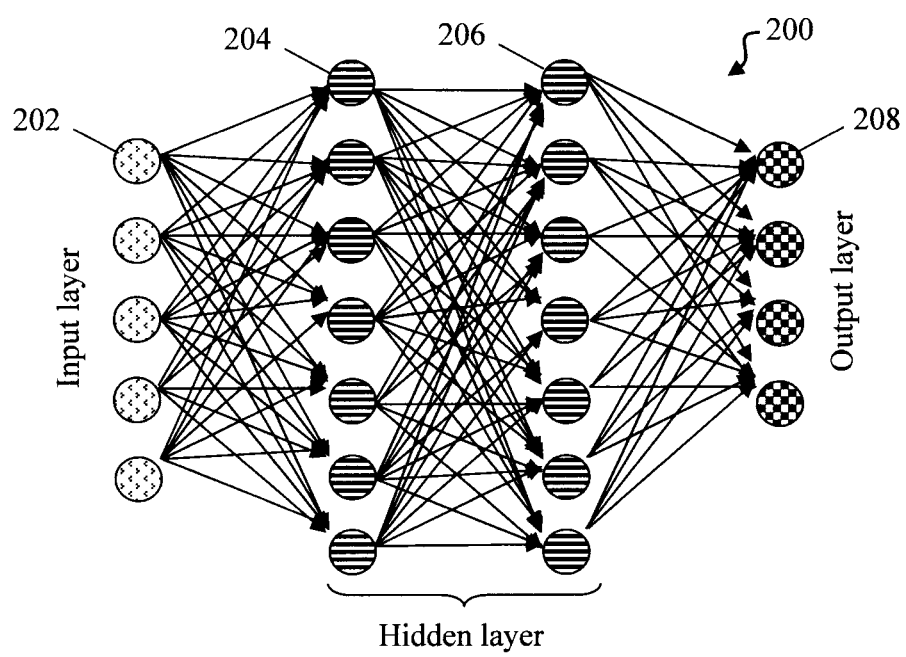
FIG. 2 is a schematic diagram illustrating an exemplary deep neural network according to an embodiment of the present invention.

Deep neural networks are often embodied as so-called "neuromorphic" systems of interconnected processor elements that act as simulated "neurons" that exchange "messages" between each other in the form of electronic signals. See, for example, FIG. 2 which provides a schematic illustration of an exemplary deep neural network 200. As shown in FIG. 2, deep neural network 200 includes a plurality of interconnected processor elements 202, 204/206 and 208 that form an input layer, at least one hidden layer, and an output layer, respectively, of the deep neural network 200. By way of example only, deep neural network 200 can be embodied in an analog cross-point array of resistive devices such as resistive processing units (RPUs).

Similar to the so-called 'plasticity' of synaptic neurotransmitter connections that carry messages between biological neurons, the connections in a deep neural network that carry electronic messages between simulated neurons are provided with numeric weights that correspond to the strength or weakness of a given connection. The weights can be adjusted and tuned based on experience, making deep neural networks adaptive to inputs and capable of learning. For example, a deep neural network for image classification is defined by a set of input neurons (see, e.g., input layer 202 in deep neural network 200) which may be activated by the pixels of an input image. After being weighted and transformed by a function determined by the network's designer, the activations of these input neurons are then passed to other downstream neurons, which are often referred to as 'hidden' neurons (see, e.g., hidden layers 204 and 206 in deep neural network 200). This process is repeated until an output neuron is activated (see, e.g., output layer 208 in deep neural network 200). The activated output neuron makes a class decision.

Instead of utilizing the traditional digital model of manipulating zeros and ones, deep neural networks such as deep neural network 200 create connections between processing elements that are substantially the functional equivalent of the core system functionality that is being estimated or approximated. For example, IBM's SyNapse computer chip is the central component of an electronic neuromorphic machine that attempts to provide similar form, function and architecture to the mammalian brain. Although the IBM SyNapse computer chip uses the same basic transistor components as conventional computer chips, its transistors are configured to mimic the behavior of neurons and their synapse connections. The IBM SyNapse computer chip processes information using a network of just over one million simulated "neurons," which communicate with one another using electrical spikes similar to the synaptic communications between biological neurons. The IBM SyNapse architecture includes a configuration of processors (i.e., simulated "neurons") that read a memory (i.e., a simulated "synapse") and perform simple operations. The communications between these processors, which are typically located in different cores, are performed by on-chip network routers.

Referring back to methodology 100 of FIG. 1, in step 108 a classification function is learned using the encoded base model. Advantageously, the classification function learned using the encoded base model is more general than a classification function would be if simply learned using the uncoded base model.

As will be described below, one or more elements of the present techniques can optionally be provided as a service in a cloud environment. For instance, by way of example only, the input samples can reside remotely on a cloud server. Also, the input feature encoding, encoded model construction and/or classification function learning can be performed on a dedicated cloud server to take advantage of high-powered CPUs and GPUs, after which the result is sent back to the local device.

As highlighted above, the present techniques apply tools from algorithmic information theory and coding theory to the problem of classifier generalization. The goal is to minimize the generalization error for a classification task, defined as the difference between training and inference errors, given training and test sets that are not sufficiently representative of the empirical sample set from which input samples are drawn at inference time. A learned classification function is said to be more general with respect to the target classification function with a decreasing generalization error. To accomplish this goal, a necessary and sufficient condition is derived for generalization and, based on that condition, classifier generalization is cast as an optimization problem. The present approach requires that the absolute information content of any object, e.g., a computer program, function, or set, be described and computed to determine which of a pair of learned classification functions contains more information of the target classification function.

The appropriate tool here is a concept in algorithmic information theory, namely Kolmogorov complexity, because defining the amount of information in individual objects in terms of their Kolmogorov complexity refers to these objects in isolation, not as outcomes of a known random source. In contrast, quantifying the amount of information in individual objects based, for example, on their Shannon entropy requires that these objects be treated as members of a set of objects with an associated probability distribution. As a classifier may be employed to learn a classification function from a set of features contained in such an object as, for example, a document, image, video, or sound, the Kolmogorov complexity of the set of input features, model, and outputs of the classifier is assessed.

As highlighted above, a key finding in algorithmic information theory is that the normalized information distance is a universal cognitive similarity metric, i.e., the normalized information distance between two objects minorizes any other admissible distance up to an additive logarithmic term. To derive a condition for generalization, a distance function that measures how similar two objects are in any aspect is required to determine which of two learned classification functions is closer to the target classification function (see Proof of Lemma 1 below). The closer a learned classification function is to the target classification function, the lower its generalization error is. In the context of generalization, this distance function must satisfy the metric (in)equalities, e.g., it would have to be symmetric and satisfy the triangle inequality. The normalized information distance between objects a and b, defined as:

$$D_I(a, b) = \frac{\max(K(a \mid b), K(b \mid a))}{\max(K(a), K(b))}, \quad (1)$$

wherein K(a) denotes the Kolmogorov complexity of object a and K(a|b) denotes the conditional Kolmogorov complexity of a with respect to b, satisfies the metric (in)equalities, and is a universal cognitive similarity metric because $D_I(a,b)$ minorizes all other normalized admissible distances up to a negligible additive error term. This means that all effective similarities between a pair of objects are discovered by the normalized information distance, i.e., two objects that are close according to some effective similarity are also close according to the normalized information distance.

With regard to the use of a classifier as a source code $\mathbb{X}$, a successful classifier distills information useful for its classification task T from its input samples $\vec{x}$. In doing so, the classifier ideally learns a classification function $f(\cdot)$ from the empirical sample set $\mathbb{X}^n$ to an m-ary signal alphabet $\mathbb{A}$ of classes u in such a way that some information in $\vec{x}$ is given less weight in determining its relevance to the class decision it or is entirely discarded. For example, the arg max operation discards some information in deep neural networks. A classifier is thus acting as a source code C. Proofs of the following statements are given below.

Lemma 1. For a classification task T wherein each n-dimensional input sample $\vec{x}$ is mapped to a class u drawn from an m-ary signal alphabet $\mathbb{A}$, the target output function $f(\bullet)$ of a supervised learning algorithm is a source code C for a multivariate random variable $\vec{X}$.

Lemma 1 reformulates a supervised learning algorithm as a procedure for searching for a source code C for a multivariate random variable $\vec{X}$, which compresses the values that this random variable takes, which is $\vec{x}$. When a classifier generalizes well with respect to $f(\bullet)$, it is able to decide which information in $\vec{x}$ is more relevant to û.

Corollary 1. The target source code $C=f(\bullet)$ of a supervised learning algorithm used for the classification task T is a lossy compressor when the Kolmogorov complexity $K(\vec{x})$ of one of its input samples is larger than the number of bits required to represent the corresponding class u.

Corollary 1 formalizes a classifier as a lossy compressor, so the source code C that corresponds to the target output function $f(\bullet)$ is not uniquely decodable, i.e., its input samples $\vec{x}$ cannot be recovered from the class u to which they are mapped. The reformulation of a supervised learning algorithm as a procedure for searching for a source code is described below. The similarity between these two source codes is then expressed by using the normalized information distance.

Regarding achieving classifier generalization, the normalized information distance:

$$D_1(C, \tilde{C}) = \frac{\max(K(C|\tilde{C}), K(\tilde{C}|C))}{\max(K(C), K(\tilde{C}))} \quad (2)$$

between the target source code C and learned source code $\tilde{C}$ reveals how general $\tilde{C}$ is with respect to C because $D_f(C,\tilde{C})$ is a universal cognitive similarity metric. It then follows that a necessary and sufficient condition for learned source code $\tilde{C}_0$ to be more general than learned source code $\tilde{C}_1$ with respect to the C is $$D_f(C,\tilde{C}_0) < D_f(C,\tilde{C}_1), \forall \tilde{C}_0 \neq \tilde{C}_1. \quad (3)$$

Equation 3 is a direct result of using the normalized information distance as a universal cognitive similarity metric to determine whether learned source code $\tilde{C}_0$ or $\tilde{C}_1$ is more general with respect to C. Because the normalized information distance is a metric that uncovers all effective similarities between the target source code and a learned source code, learning a source code that is closer to C under this metric ensures achieving generalization. Thus, $D_f(C,\tilde{C})$ must be minimized in order to minimize the generalization error.

C is a mapping from $\mathbb{X}^n$ to $\mathbb{A}$; i.e., $C: \mathbb{X}^n \to \mathbb{A}$. In a real-world setting, however, because $\mathbb{X}^n$ may be too large, the learning algorithm sees input samples $\vec{x}_S$ drawn from a subset $\mathbb{X}_S^n$ of $\mathbb{X}^n$. The learned source code $\tilde{C}$ is thus a mapping from the set $\mathbb{X}_S^n$ of available input samples to $\mathbb{A}$; i.e., $C: \mathbb{X}^n_S \to \mathbb{A}$.

Theorem 1. When a supervised learning algorithm used for the classification task T finds a suboptimal source code $\tilde{C}: \mathbb{X}_S^n \to \mathbb{A}$ instead of the target source code $C: \mathbb{X}^n \to \mathbb{A}$, the optimization problem for the generalization of $\tilde{C}$ is $\min_{\tilde{C}} ((D_f(C,\tilde{C})) = \min_{\tilde{C}} \max (K(C|\tilde{C}),K(\tilde{C}|C))$.

Theorem 1 formulates the optimization objective for classifier generalization as the minimization of $D_f(C,\tilde{C})$ and suggests that the learned function must be sufficiently complex for the classification task T to achieve generalization.

Theorem 1 states that the conditional Kolmogorov complexity $K(\tilde{C}|C)$ of the program that computes how to go from $\tilde{C}$ to C or the conditional Kolmogorov complexity $K(\tilde{C}|C)$ of the program that computes how to go from C to $\tilde{C}$, whichever is larger, must be minimized in order to minimize the generalization error. Thus, the goal is to increase $K(\tilde{C})$ while $\tilde{C}$ remains a partial function of C, i.e., $K(\tilde{C}) < K(C)$.

Therefore, Occam's first razor still holds, i.e., simpler classifiers generalize better than complex ones. However, a classifier that does not perform well on $\mathbb{X}^n$ is too simple for its classification task. Ideally, the learning algorithm would learn C, achieving the best possible performance metrics determined by its classification task T. In practice however, because the learning algorithm sees only a subset $\mathbb{X}_S^n$ of $\mathbb{X}^n$, $\tilde{C}$ is a partial function of C. Next, a source code is learned that is more general on $\mathbb{X}^n$, not only on a cross-validation set and/or test set.

The complexity of $\tilde{C}$ is increased by generating I encodings $E=\{E_0, E_1, \ldots E_{I-1}\}$ of $\vec{x}_S \in \mathbb{X}_S^n$ that capture relations between the features that are represented in $\mathbb{X}^n$, but not in $\mathbb{X}_S^n$, and appending these encodings to $\vec{x}_S$. By providing different relations between the features, the encodings E help the learning algorithm to learn a more complex source code $\tilde{C}_E$ for which $D_f(C,\tilde{C}_E) < D_f(C,\tilde{C})$. This results in learning a more general source code.

Theorem 2. For classification task T, a more general suboptimal code $\tilde{C}_E$ is learned from the concatenation $\{\vec{x}_S, E(\vec{x}_S)\}$, wherein $E(\bullet)$ is a concatenation of encodings $E_i$: $\mathbb{X}_S^n \to \mathbb{Y}_{S,i}^n$ of the input sample $\vec{x}_S$ such that $\mathbb{Y}_{S,i}^n \subseteq \mathbb{X}^n$ and $\mathbb{Y}_{S,i}^n \not\subseteq \mathbb{X}_S^n$.

Any encoding $E_i$: $\mathbb{X}_S^n \to \mathbb{Y}_{S,i}^n$, where $\mathbb{Y}_{S,i}^n$ is an encoding codomain such that $\mathbb{Y}_{S,i}^n \subseteq \mathbb{X}^n$ and $\mathbb{Y}_{S,1}^n \not\subseteq \mathbb{X}_S^n$, when concatenated with $\vec{x}_S$, increases the Kolmogorov complexity of the learned source code, which is now called $\tilde{C}_E$: $\mathbb{Z}_S^n \to \mathbb{A}$, where $\mathbb{Z}_S^n = \mathbb{X}_S^n \cup \mathbb{Y}_S^n$ and $\mathbb{Y}_S^n = \mathbb{Y}_{S,0}^n \cup \mathbb{Y}_{S,1}^n \cup \ldots \cup \mathbb{Y}_{S,I-1}^n$. This finding results from the fact that C learned from $\mathbb{X}_S^n$ is a partial function of $\tilde{C}_E$ learned from $\{\vec{x}_S, E(\vec{x}_S)\}$ because $\mathbb{Z}_S^n \supset \mathbb{X}_S^n$. Consequently, max(K$(C|\tilde{C}_E),K(\tilde{C}_E|C)) < \max(K(C|\tilde{C}),K(\tilde{C}|C))$, which results in $D_f(C,\tilde{C}_E) < D_f(C,\tilde{C})$. $\tilde{C}_E$ is thus a more general source code than $\tilde{C}$ with respect to C.

Figure 3:
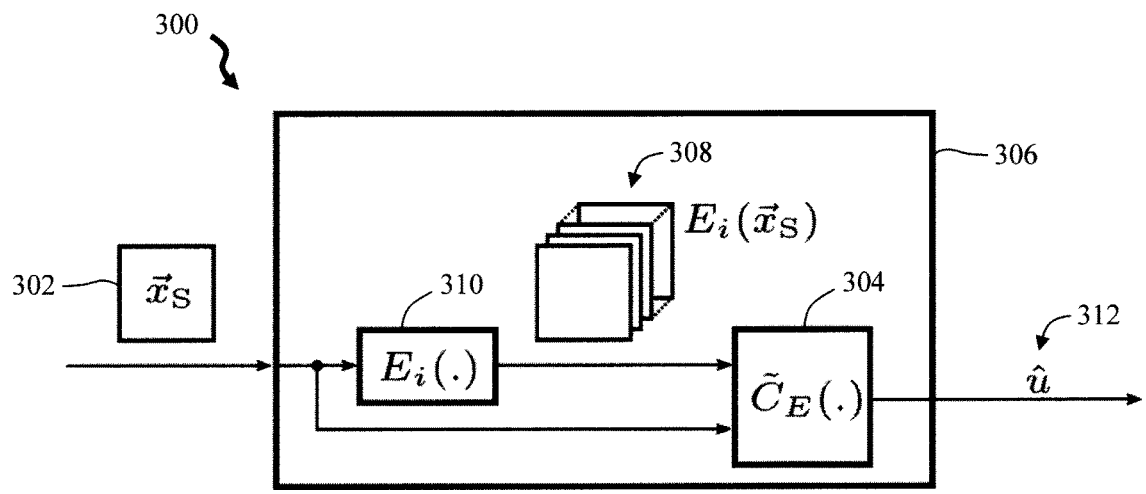
FIG. 3 is a diagram illustrating an exemplary encoded model architecture according to an embodiment of the present invention.

In contrast to a typical communication system, Theorem 2 considers a learning system where an input code is followed by a learned source code, and the design goal is for the composition of the input and source codes to generalize as well as possible. See FIG. 3. FIG. 3 is a diagram illustrating an exemplary encoded model architecture 300 built, e.g., in accordance with methodology 100, described in conjunction with the description of FIG. 1 above. As shown in FIG. 3, an uncoded model simply feeds (original/uncoded) input features 302 to a base model 304, while the encoded model 306 stacks the (original/uncoded) input features 302 and encoded features 308 (encoded by encoder 310) and feeds those to the base model 304 with enough input channels to handle the (original/uncoded) input features 302 and the encoded features 308. The encoded model 306 learns a classification function for use in classification. The output for a classification task is a class decision 312. Encoded model architecture 300 can be embodied in a computer-based apparatus such as apparatus 1400 described in conjunction with the description of FIG. 14, below.

The "physical channel" precedes the source code in a learning system, and it can be formulated as a process whereby $\mathbb{X}^n$ is reduced to $\mathbb{X}_S^n$ and/or whereby common corruptions and adversarial perturbations are applied to $\mathbb{X}_S^n$. As the "physical channel" comes first in a learning system, there is access to only a subset of information bits, which may have been subjected to common corruptions or adversarial perturbations. It is therefore crucial for a supervised learning algorithm to compress its features while retaining information useful for its classification task. One way to accomplish this is to extend the input features with encodings that capture relations between features that are represented in $\mathbb{X}^n$, but not in $\mathbb{X}_S^n$. The features encoded by a uniquely decodable code, e.g., TCM, by definition, contain the information of the original uncoded input features. The features encoded by a uniquely decodable code are thus in $\mathbb{X}^n$. The input-encoding method does not change the classification task T of the classifier, which is defined by the mapping between the input features and the output, because the only input to the encoded model is the uncoded input features (see FIG. 3). The encoder 310 is simply a new layer in the encoded model 306, which is designed from the encoder 310 and the uncoded base model 304.

For approximating normalized information distance by normalized compression distance, the normalized information distance is based on the notion of Kolmogorov complexity, which is not a partial recursive function, i.e., it is not effectively computable. While the normalized information distance can be used to analyze whether a source code $\tilde{C}_E$ learned from $\{\vec{x}_S, E(\vec{x}_S)\}$ is more general with respect to C, in practice the normalized information distance with the normalized compression distance may need to be approximated in order to determine which of any pair of source codes is more general with respect to C.

Based on a real-world compressor Z, the normalized compression distance:

$$D_c(C, \tilde{C}_E) = \frac{Z(\{C, \tilde{C}_E\}) - \min(Z(C), Z(\tilde{C}_E))}{\max(Z(C), Z(\tilde{C}_E))} \quad (4)$$

approximates $D_f(C, \tilde{C}_E)$. Thus, the generalization condition in Equation 3 and minimization of $D_f(C, \tilde{C}_E)$ can be cast in effectively computable forms. Equations 2 and 4 are used to derive theoretical results, particularly the use of input codes to achieve generalization as illustrated experimentally below.

Proposition 1. For the classification task T, $D_f(C, \tilde{C}_E) < D_f(C, \tilde{C}) \Leftrightarrow Z(\tilde{C}_E) > Z(\tilde{C})$.

Proposition 1 states for classification task T that if and only if $\tilde{C}_E$ learned from $\{\vec{x}_S, E(\vec{x}_S)\}$ is more general than $\tilde{C}$; i.e., $D_f(C, \tilde{C}_E) < D_f(C, \tilde{C})$, the compressed size $Z(\tilde{C}_E)$ of $C_E$ is larger than the compressed size $Z(\tilde{C})$ of $\tilde{C}$.

Proposition 2. When a supervised learning algorithm used for classification task T finds a suboptimal source code $\tilde{C}_E$: $\mathbb{Z}_S^n \rightarrow \mathbb{A}$ instead of the target source code C: $\mathbb{X}^n \rightarrow \mathbb{A}$, the effectively computable optimization problem for the generalization of $\tilde{C}_E$ is $\min_{\tilde{C}_E} D_C(C, \tilde{C}_E) = \max_{\tilde{C}_E} Z(\tilde{C}_E)$.

Proposition 2 shows that $Z(\tilde{C}_E)$ must be maximized until it reaches Z(C) to learn the most general source code with respect to C for the classification task T. This statement is a consequence of the fact that $\tilde{C}_E$ is a partial function of C. In other words, $\tilde{C}_E$ learned from $\{\vec{x}_S, E(\vec{x}_S)\}$ can be made more general if $E(\vec{x}_S)$ bear information of relations between input features that are represented in $\mathbb{X}^n$, but not in $\mathbb{X}_S^n$, which is satisfied if E(•) is a uniquely decodable code.

A channel encoder such as encoder 310 generates encodings from its input features that enable a classifier to learn relations between these features represented in $\mathbb{X}^n$, but not in $\mathbb{X}_S^n$. Concatenated together, these features are input to a model to produce a class decision a. As an illustration of this idea, a 4-D 5-PAM TCM scheme is used as a systematic way to generate multiple encodings of input features. See, for example, channel encoder 400 illustrated in FIG. 4. Channel encoder 400 represents one exemplary configuration of the encoder 310 in encoded model architecture 300 and thus can be embodied in a computer-based apparatus such as apparatus 1400 described in conjunction with the description of FIG. 14, below.

Figure 4:
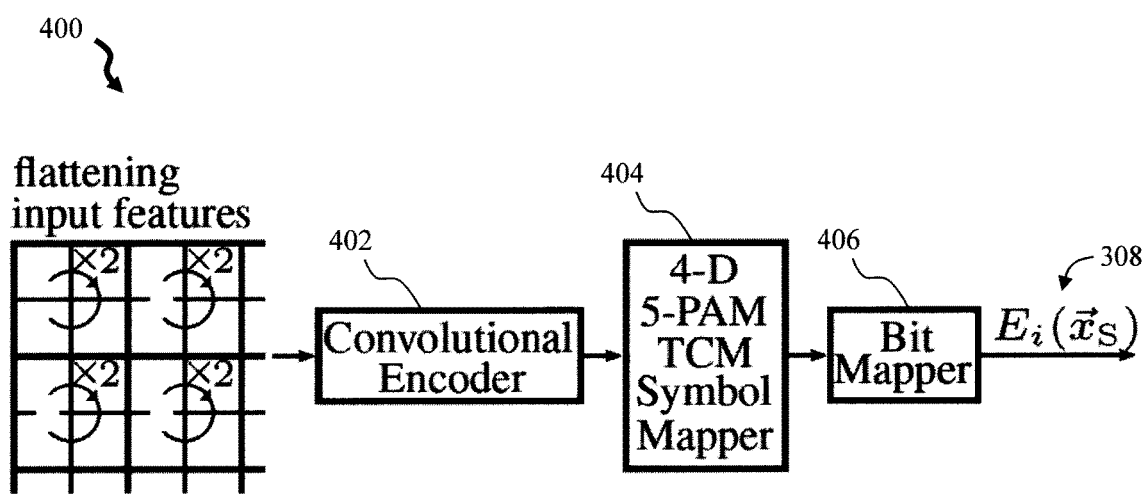
FIG. 4 is a diagram illustrating an exemplary channel encoder according to an embodiment of the present invention.

As shown in FIG. 4, channel encoder 400 first flattens the input features. The flattened features are then fed to a convolutional encoder 402 which produces one extra bit out of the two least significant bits representing each feature. A 4-D 5-PAM TCM symbol mapper 404 then maps each bit into four equidistant 5-PAM symbols, which are then mapped by a bit mapper 406. As highlighted above, channel encoder 400 produces encoded features 308. Notably, each encoded feature has the same size as that in the original input samples. Further information on the encoding scheme and channel encoder is provided below.

The present techniques are further described by way of reference to the following non-limiting examples. $\mathbb{X}^n$ contains the set of available input samples subjected to common corruptions and adversarial perturbations. Experiments were conducted on an image dataset containing test samples corrupted with varying levels of noise and an image dataset containing training and test samples (also referred to herein as dataset I and dataset II, respectively) to show that using channel codes on the input features results in learning a more general source code with respect to the target source code, which increases robustness to common corruptions and adversarial perturbations. Uncoded and encoded Visual Geometry Group (VGG)-11 and VGG-16 models and an uncoded Residual Networks (ResNet)-18 model were trained. The training setup and the achieved test accuracies are given below.

In all experiments conducted on the encoded models, arbitrary encodings were used. The input samples were corrupted or perturbed before they were input to the encoded models, as the uncorrupted or unperturbed input samples are not available in a real-world application. Increasing the number of encodings may reduce the generalization error, but at the cost of increased run time. However, encoding the training and test samples is a one-time process that can be done prior to training, unlike adversarial training, which requires generating perturbed input samples in each epoch. As highlighted above, increasing the number of input channels does not, as such, confer robustness to Gaussian noise or to PGD.

Regarding robustness to common corruptions, the set of available input samples may be subjected to common corruptions before reaching a real-world image classifier. For example, Gaussian noise can appear in low-lighting conditions, and shot noise can be caused by the discrete nature of light. To show robustness to such corruptions, experiments were conducted on dataset I and dataset II. Four common corruptions were used in the experiments, namely Gaussian noise, shot noise, impulse noise, and speckle noise.

Figures 5A, 5B, 5C, 6:
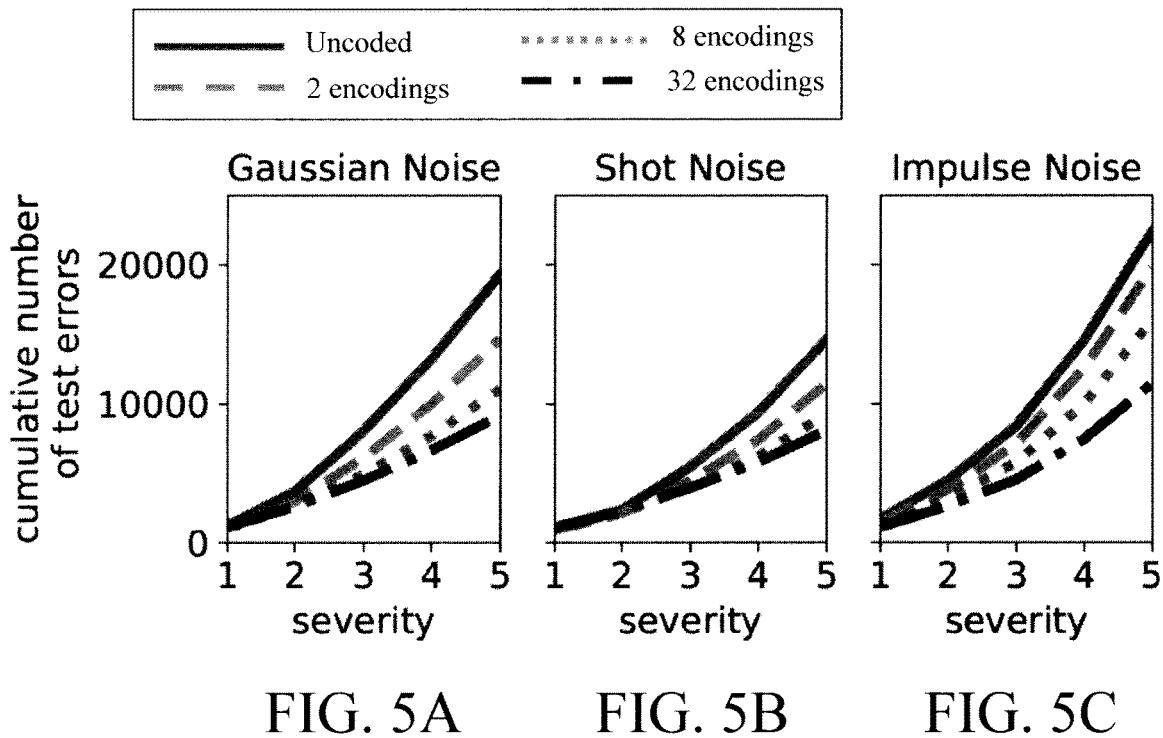
FIG. 5A is a diagram illustrating uncoded and encoded VGG-11 models tested on samples in an image dataset containing test samples corrupted with varying levels of noise (dataset I), in this case Gaussian noise according to an embodiment of the present invention.
FIG. 5B is a diagram illustrating the uncoded and encoded VGG-11 models tested on the samples in the dataset I corrupted with varying levels of shot noise according to an embodiment of the present invention.
FIG. 5C is a diagram illustrating the uncoded and encoded VGG-11 models tested on the samples in the dataset I corrupted with varying levels of impulse noise according to an embodiment of the present invention.
FIG. 6 is a diagram comparing the inference accuracy of the encoded VGG-11 model with 32 encodings with prior methods on the dataset I corrupted with a severity level of 5 according to an embodiment of the present invention.

FIGS. 5A, 5B, and 5C illustrate the uncoded and encoded VGG-11 models tested on the samples in the dataset I, i.e., an image dataset containing test samples corrupted with varying levels of Gaussian noise, shot noise and impulse noise, respectively. As shown in FIGS. 5A, 5B, and 5C, increasing the number of encodings concatenated to the original samples increases robustness to Gaussian noise, shot noise, and impulse noise, respectively. Additional experimental results, including those for speckle noise, and information about the dataset I are provided below, as are comparable experimental results obtained with an encoded VGG-16 model with 32 encodings.

Table 600 shown in FIG. 6 compares the inference accuracy of the encoded VGG-11 model with 32 encodings with previously published methods on the dataset I. In FIG. 6, GN is Gaussian noise, SN is shot noise, IN is impulse noise, RPO is replacing pooling operator, JT is joint training, TTT is test-time training, TTTO is test-time training online, ALP is adversarial logit pairing, and CE is channel encoding as per the present techniques. As shown in FIG. 6, the encoded VGG-11 model achieves the highest inference accuracy $A_{infer}^{(SN)}$ of 77.58% against shot noise with a severity level of 5 compared with all the other works listed in table 600, which use a ResNet-18 or ResNet-26 model. The highest inference accuracy $A_{infer}^{(GN)}$ of 77.30% against Gaussian noise is attained by ALP, but the test accuracy $A_{test}$ of this method is 83.50%, whereas the encoded VGG-11 model achieves the second highest $A_{infer}^{(GN)}$ of 75.22% with a $A_{test}$ of 90.19%. The highest inference accuracy $A_{infer}^{(IN)}$ of 71.70% against impulse noise is attained by ALP as well, whereas the encoded VGG-16 model achieves the second highest $A_{infer}^{(IN)}$. These results indicate that using a larger number of encodings improves robustness to common corruptions, so the inference accuracy achieved by the channel-encoding method may be improved by merely increasing the number of encodings or designing higher performance codes.

To show robustness to adversarial perturbations without adversarial training, experiments were conducted on the dataset II, i.e., image dataset containing training and test samples. The white-box PGD and transfer perturbations from an uncoded VGG-16 and an uncoded ResNet-18 model were used to evaluate the adversarial robustness of the encoded VGG-16 models. The white-box PGD uses the gradient of the loss function with respect to the uncoded input features in the encoded VGG-16 models because the channel encoder is part of the encoded VGG-16 models, i.e., the only input to the encoded model is the uncoded input features. The encoder is a new layer in the neural network whose outputs are computed directly from the uncoded input features.

Figures 7A, 7B, 7C, 8:
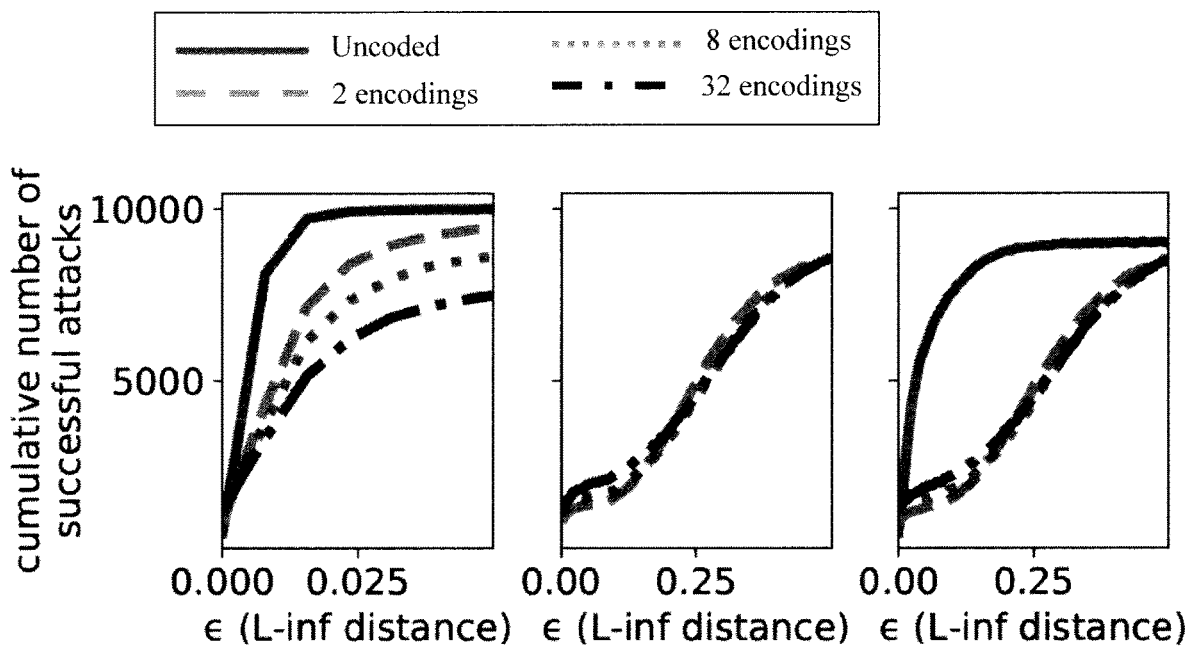
FIG. 7A is a diagram illustrating results of white-box PGD adversarial perturbations according to an embodiment of the present invention.
FIG. 7B is a diagram illustrating results of transfer PGD (uncoded VGG-16) adversarial perturbations according to an embodiment of the present invention.
FIG. 7C is a diagram illustrating results of transfer PGD (ResNext-18) adversarial perturbations according to an embodiment of the present invention.
FIG. 8 is a diagram comparing the encoded model with prior defense models under white-box PGD adversarial perturbations on an image dataset containing training and test samples (dataset II) according to an embodiment of the present invention.

FIGS. 7A, 7B and 7C illustrate results of the white-box PGD, transfer PGD (uncoded VGG-16) and transfer PGD (ResNext-18), respectively. FIG. 7A illustrates the increase in robustness to white-box PGD starting from a random perturbation around the natural example and using 20 iterations and a step size of 0.003. Robustness to white-box PGD adversarial perturbations systemically increased with an increasing number of encodings concatenated to the input features at the expense of test accuracy $A_{test}$. For example, at an $\ell_\infty$ distance of 0.03, the inference accuracy $\mathbb{A}_{infer}$ of the VGG-16 model with 32 encodings is 30.19% with a $A_{test}$ of 87.38%. As described below, additional experimental results were obtained by scaling the outputs of the encoder in the encoded VGG-16 model with 2 encodings, which reduces its $A_{test}$ while increasing its $\mathbb{A}_{infer}$. See table 800 in FIG. 8. In table 800, AT is adversarial training, and CE is channel encoding as per the present techniques followed by the number of encodings, i.e., CE-2 is channel encoding with 2 channel encodings, and CE-32 is channel encoding with 32 channel encodings. Model A is a prior defense model described in Kurakin et al., "Adversarial Machine Learning at Scale," International Conference on Learning Representations, (February 2017) (17 pages), Model B is a prior defense model described in Madry et al., "Towards Deep Learning Models Resistant to Adversarial Attacks," arXiv:1706.06083v4 (September 2019) (28 pages), Model C is a prior defense model described in Wong et al., "Scaling provable adversarial defenses," arXiv:1805.12514v2 (November 2018) (22 pages), and Model D is a prior defense model described in Zhang et al., "Theoretically Principled Trade-off between Robustness and Accuracy," arXiv: 1901.08573v3 (June 2019) (31 pages).

The inference accuracies achieved in experiments using more than 1000 PGD iterations were verified to have stabilized. To test the robustness of the encoded VGG-16 models against transfer attacks using the same PGD settings, adversarial examples were generated on the uncoded VGG-16 model and uncoded ResNet-18 model. The encoded VGG-16 models show robustness to these transfer attacks as shown in FIG. 7B and FIG. 7C. For example, when adversarial examples generated on the ResNet-18 model are used to test the robustness of the uncoded VGG-16 model and the encoded VGG-16 models, at an epsilon of 0.2 ($\ell_\infty$), $\mathbb{A}_{infer}$ of the uncoded VGG-16 model is 12.25%, whereas that of the VGG-16 model with 32 encodings is 63.87%.

FIG. 8 compares the encoded VGG-16 model with previously published defenses. The present techniques achieve a sizable $A_{infer}$ of 30.19% with the highest $A_{test}$ of 87.38% among all the models listed in this table 800 and importantly does not use adversarial training. Generating input encodings can be done just once prior to training, whereas adversarial training requires generating adversarial examples in each epoch, which is expensive when an iterative method such as PGD is used. The channel-encoding method can be combined with adversarial training and other known methods to achieve greater robustness to adversarial perturbations.

Further details regarding the terms and concepts described above are now provided. A signal alphabet $\mathbb{A}$ is the set of classes u that are used for classification. For example, in binary classification, an input sample $\vec{x}$ in the empirical sample set $\mathbb{X}^n$ can be assigned to the class u=0 or u=1 in the signal alphabet $\mathbb{A}=\{0,1\}$.

Classification is a common machine learning task wherein a learning algorithm is asked to produce a function $f(\bullet)$: $\mathbb{X}^n \to \mathbb{A}$. In other words, in this type of task, the learning algorithm is asked to assign an input sample z in the empirical sample set $\mathbb{X}^n$ to a class u in the signal alphabet $\mathbb{A}$. The classification accuracy measured on the empirical sample set $\mathbb{X}^n$ is defined as inference accuracy.

The empirical sample set $\mathbb{X}^n$ seen during inference is a superset of the training set. Typically, $\mathbb{X}^n$ is a large set that is not available during training and contains real-world samples that may be subjected to common corruptions or adversarial perturbations. Moreover, $\mathbb{X}^n$ may be out of distribution of the training set. In the experiments described above, inference accuracy was simulated on the dataset I consisting of samples subjected to common corruptions or the adversarially perturbed test set of the dataset II. The definition of inference accuracy can be contrasted with that of test accuracy by considering that the former is measured on the empirical sample set $\mathbb{X}^n$ which contains corrupted or perturbed samples that may be out of distribution of the training set and that the latter is measured on the test set which consists of uncorrupted and unperturbed samples that are presumed to come from the same distribution as the training set.

The difference between the training error measured on the training set and inference error measured on the empirical sample set $\mathbb{X}^n$ is defined herein as the generalization error. As described above, this definition is different from that of prior works, which define generalization error as the difference between the training error measured on the training set and test error measured on the test set.

A learned classification function is said to be more general with a decreasing generalization error. This definition is different from that of prior works, which define a learned classification function to be more general with a decreasing difference between the training error measured on the training set and test error measured on the test set. In contrast, the present techniques define a learned classification function to be more general with a decreasing difference between the training error measured on the training set and inference error measured on the empirical sample set $\mathbb{X}^n$.

The present techniques focus on learning a source code that is more general on $\mathbb{X}^n$. Whether a model is over-fit or under-fit is conventionally determined on a cross-validation set and/or test set that are/is identically distributed with the training set, all of which are subsets of $\mathbb{X}^n$. The traditional approach of minimizing the difference between the training and test errors depends on reducing the training accuracy to increase the test accuracy so as to learn a source code that is more general on a cross-validation set and/or test set. Being more general on a cross-validation set and/or test set does not as such guarantee generalization on $\mathbb{X}^n$ because $\mathbb{X}^n$ may contain corrupted or perturbed samples and/or there may be samples in $\mathbb{X}^n$ that are out of distribution of the cross-validation set and test set. Thus, whether a model is over-fit or under-fit does not have a consequence for Theorem 1, provided above.

A source code C for a multivariate random variable $\vec{X}$ is a mapping from the sample set $\mathbb{X}^n$ of $\vec{X}$ to an m-ary signal alphabet $\mathbb{A}$. Source codes are designed for the most efficient representation of data. Whether it is designed for a data-transmission or a data-storage system, a source code, whether lossless or lossy, should retain information about the data necessary to accomplish a given task. The same consideration applies to a learning system. The information in the input features of a learning system is represented by the classification function that it learns. Thus, a neural network can be viewed as a source code that encodes inputs features for its classification task.

The reformulation of a supervised learning algorithm as a procedure for searching for a source code (see Lemma 1 above) permits leveraging theoretical results from algorithmic information theory and coding theory for machine learning, thereby avoiding the necessity to reinvent theory that is already established in these fields. Drawing on algorithmic information theory and coding theory, it is shown that a classifier is a lossy compressor when the absolute information content of any of its input samples $\vec{x}$ is larger than that of the class u to which it is mapped (see Corollary 1 above).

In a typical communication system, the source code compresses the input bits for a channel code to encode these bits against noise and interference in the channel. The encoded information is then transmitted over the physical channel. The design goal for the source and channel codes is to achieve the channel capacity, the maximum mutual information between the channel input and output. Channel codes appropriate for a channel can be designed separately and independently. This combination is as efficient as any other method that can be designed by considering both problems together.

Leveraged herein is the duality of a source code and a channel code to learn a classification function that represents the input features more efficiently for the classification task T, i.e., a more general classification function. Showing that a classifier is a non-uniquely decodable source code is also fundamental to understanding that the normalized information distance between the input features and the output cannot be used to derive a condition for classifier generalization. This results from the fact that deriving such a condition would require finding the conditional Kolmogorov complexity $K(\vec{x}|y)$ of z with respect to y, which is impossible because the source code is not uniquely decodable, i.e., the program to go from y to $\vec{x}$ cannot be found. A necessary and sufficient condition for classifier generalization based on the normalized information distance can hence be found only between a learned source code and the target source code.

The Kolmogorov complexity $K_U(x)$ of a string x with respect to a universal computer U is defined as:

$$K_U(x) = \min_{p:U(p)=x} l(p), \quad (5)$$

wherein p denotes a program, and l(p) denotes the length of the program p. Thus, $K_U(x)$ is the shortest description length of x over all descriptions interpreted by computer U. Such a universal computer U is fixed as reference and thus $K_U(x)=K(x)$. Kolmogorov complexity is a measure of absolute information content of individual objects.

It is desirable to have a measure of absolute information distance between any number of individual objects. Such a notion is to be universal in the sense that it covers all other alternative or intuitive notions of computable distances as special cases and is to be asymptotically machine-independent in order that it can serve as an absolute measure of the information distance between discrete objects a and b.

Such a measure is the information distance:

$$\max(K(a|b),K(b|a)), \quad (6)$$

which is normalized by:

$$\max(K(a),K(b)) \quad (7)$$

to obtain the normalized information distance in Equation 1 above because two larger objects that differ by a small amount are closer than two smaller objects that are different by the same amount: the absolute difference between two objects does not measure similarity as such, but the relative difference does.

The normalized information distance is a metric, which is universal in the sense that it minorizes up to a negligible additive error term all other normalized admissible distances. Therefore, if two objects are similar according to the particular feature described by a particular normalized admissible distance, which is not necessarily a metric, then they are also similar under the normalized information distance metric. Put differently, different pairs of objects may have different dominating features, and every such dominant similarity is detected by the normalized information distance. The normalized information distance is hence a universal cognitive similarity metric. The universality of the information distance renders it not effectively computable. However, the study of the abstract properties of such an absolute information distance results in applicable formulas and practical approaches.

Regarding compression distance, the normalized compression distance in Equation 4 above approximates the normalized information distance in Equation 2. The idea behind the normalized compression distance is that two objects are close if one of them can be significantly compressed given the information in the other. In other words, if two objects are more similar, then one of them can be described more succinctly given the other. The normalized compression distance is parameter-free because it does not use any feature or background knowledge of the data and can be applied to different areas without a change. It is universal in the sense that it approximates the normalized information distance in all pairwise comparisons. Moreover, its success is independent of the type of real-world compressor used.

A proof of mathematical statements is now provided.

Proof of Lemma 1. For a classification task T wherein each n-dimensional input sample $\vec{x}_S$ is mapped to a class u drawn from an m-ary signal alphabet $\mathbb{A}$, a supervised learning algorithm is asked to produce the target output function $$f(\cdot): \mathbb{X}^n \to A, \quad (8)$$

wherein $\mathbb{X}^n$ is the empirical sample set. There exists a source code:

$$C: \mathbb{X}^n \to \mathbb{A} \quad (9)$$

for a multivariate random variable $\vec{x}$ with the same mapping from the empirical sample set $\mathbb{X}^n$ of $\vec{X}$ to the m-ary signal alphabet $\mathbb{A}$ from which a class u is drawn. The target output function $f(\cdot)$ in Equation 8 is equivalent to the source code C in Equation 9 for the multivariate random variable $\vec{X}$ because their domain $\mathbb{X}^n$ and codomain $\mathbb{A}$ are equal, and the image of both $f(\cdot)$ and C is the same for each input sample $\vec{x} \in \mathbb{X}^n$.

The target source code C in Equation 9 is defined to have the same mappings, whether correct or not, from $\mathbb{X}^n$ to $\mathbb{A}$ as the source code $\tilde{C}: \mathbb{X}_S^n \to \mathbb{A}$ learned from the set $\mathbb{X}_S^n$ of available input samples, where $\mathbb{X}_S^n \subset \mathbb{X}^n$. The target source code C thus has the property that it is the total function of the learned source $\tilde{C}$ at any training accuracy on $\mathbb{X}_S^n$.

Proof of Corollary 1. If the Kolmogorov complexity $K(\vec{x})$ of an input sample $\vec{x}$ is larger than the number of bits required to describe the class u to which it is mapped, which is at most $\lceil \log_2 m \rceil$, then, by the definition of Kolmogorov complexity given above, some information about the input sample $\vec{x}$ is lost. Satisfying this condition, the target source code C is a lossy compressor.

Proof of Theorem 1. The normalized information distance:

$$D_I(C, \tilde{C}) = \frac{\max(K(C \mid \tilde{C}), K(\tilde{C} \mid C))}{\max(K(C), K(\tilde{C}))} \quad (10)$$

is a universal cognitive similarity metric that minorizes all other admissible distances up to a negligible additive error term. This means that decreasing the normalized information distance $D_I(C,\tilde{C})$ ensures that the target source code C and the learned source code $\tilde{C}$ are more similar, i.e., the learned source code $\tilde{C}$ is more general with respect to the target source code C. In a real-world setting, because the empirical sample set $\mathbb{X}^n$ is typically a large set, the supervised learning algorithm sees an input sample $\vec{x}_S$ drawn from a subset $\mathbb{X}_S^n$ of $\mathbb{X}^n$:

$$\vec{x}_S \in \mathbb{X}_S^n, \mathbb{X}_S^n \subset \mathbb{X}^n. \quad (11)$$

Put differently, the set $\mathbb{X}_S^n$ of available input samples on which a neural network is trained is a subset of the empirical sample set $\mathbb{X}^n$ which the trained neural network sees during inference. This means that target source code C bears information of all possible relations between input features, which are contained in the empirical sample set $\mathbb{X}^n$, whereas the learned source code $\tilde{C}$ bears information of a subset of all possible relations between the input features, which are contained in $\mathbb{X}_S^n$. Because the target source code C in Equation 9 above has the property that it is the total function of the learned source $\tilde{C}: \mathbb{X}_S^n \to \mathbb{A}$ at any training accuracy on $\mathbb{X}_S^n$, the learned source code $\tilde{C}$ is a partial function of the target source code C, i.e., $$\tilde{C}: \mathbb{X}^n \mapsto \mathbb{A}, \quad (12)$$

at any training accuracy. In other words, the reason why Equation 12 holds is that Equation 11 holds and that the target source code C in Equation 9 is defined to have the same mappings, whether correct or not, from $\mathbb{X}^n$ to $\mathbb{A}$ as the learned source code $\tilde{C}$. Given Equation 12, the Kolmogorov complexity of the target source code C is larger than that of the learned source code $\tilde{C}$:

$$K(C) > K(\tilde{C}). \quad (13)$$

Therefore, for a given target source code C, the denominator of Equation 10

$$\max(K(C), K(\tilde{C})) = K(C) \quad (14)$$

is a constant. Using Equation 14 in minimizing Equation 10 over the learned source code $\tilde{C}$ $$\min_{\tilde{C}}(D_I(C, \tilde{C})) = \min_{\tilde{C}}\left(\frac{\max(K(C \mid \tilde{C}), K(\tilde{C} \mid C))}{\max(K(C), K(\tilde{C}))}\right) \quad (15)$$

$$= \min_{\tilde{C}}\left(\frac{\max(K(C \mid \tilde{C}), K(\tilde{C} \mid C))}{K(C)}\right)$$

$$= \min_{\tilde{C}} \max(K(C \mid \tilde{C}), K(\tilde{C} \mid C))$$

results in minimizing over the learned source code $\tilde{C}$ the maximum of the conditional Kolmogorov complexities $\{K(C|\tilde{C}), K(\tilde{C}|C)\}$. Hence, Equation 15 is the optimization problem for the generalization of the learned source code $\tilde{C}$ with respect to the target source code C.

Proof of Theorem 2. Let $\tilde{C}_E$ denote a source code learned from a concatenation $$\{\vec{x}_S, E(\vec{x}_S)\} \tag{16}$$

of uncoded input samples $\vec{x}_S \in \mathbb{X}_S^n$ and encoded input samples $E(\vec{x}_S) = \{E_0(\vec{x}_S), E_1(\vec{x}_S), \ldots, E_{I-1}(\vec{x}_S)\}$, where the ith encoding $$E_i: \mathbb{X}_S^n \to \mathbb{Y}_{S,i}^n \tag{17}$$

is a mapping from the set $\mathbb{X}_S^n$ of available input samples to an encoding codomain denoted by $\mathbb{Y}_{S,i}^n$. The encoding codomain $\mathbb{Y}_{S,i}^n$ satisfies two properties:

$$\mathbb{Y}_{S,i}^n \subseteq \mathbb{X}^n \text{ and}$$

$$\mathbb{Y}_{S,i}^n \not\subseteq \mathbb{X}_S^n.$$

The codomain $\mathbb{Y}_S^n$ of the I encodings E is the union of the codomains of all the encodings, i.e., $$\mathbb{Y}_S^n = \mathbb{Y}_{S,0}^n \cup \mathbb{Y}_{S,1}^n \cup \ldots \cup \mathbb{Y}_{S,I-1}^n \tag{18}$$

Because $\mathbb{Y}_{S,i}^n \subseteq \mathbb{X}^n$ and $\mathbb{Y}_{S,i}^n \not\subseteq \mathbb{X}_S^n$, the set $\mathbb{Y}_S^n$ of available encoded samples has the following two properties:

$$\mathbb{Y}_S^n \subseteq \mathbb{X}^n \text{ and}$$

$$\mathbb{Y}_S^n \not\subseteq \mathbb{X}_S^n.$$

$\mathbb{Z}_S^n$ denotes the union of the set $\mathbb{X}_S^n$ of available input samples and the set $\mathbb{Y}_S^n$ of available encoded samples:

$$\mathbb{Z}_S^n = \mathbb{X}_S^n \cup \mathbb{Y}_S^n, \tag{19}$$

which satisfies the following two properties:

$$\mathbb{Z}_S^n \subseteq \mathbb{X}^n \text{ and}$$

$$\mathbb{Z}_S^n \supset \mathbb{X}_S^n.$$

The source code $\tilde{C}_E$ learned from Equation 16 above is thus a mapping from $\mathbb{Z}_S^n$ to the signal alphabet $\mathbb{A}$:

$$\tilde{C}_E: \mathbb{Z}_S^n \to \mathbb{A} \tag{20}$$

As $\mathbb{Z}_S^n \supset \mathbb{X}_S^n$, the source code $\tilde{C}$ learned from the set $\mathbb{X}_S^n$ of available input samples is a partial function of the source code $\tilde{C}_E$ learned from Equation 16:

$$\tilde{C}: \mathbb{Z}_S^n \mapsto \mathbb{A}. \tag{21}$$

Hence, the Kolmogorov complexity $K(\tilde{C}_E)$ of the source code $\tilde{C}_E$ is larger than $K(\tilde{C})$:

$$K(\tilde{C}_E) > K(\tilde{C}). \tag{22}$$

As $\mathbb{Z}_S^n \subseteq \mathbb{X}^n$, the Kolmogorov complexity of the target source code C is larger than that of the learned source code $\tilde{C}_E$:

$$K(C) > K(\tilde{C}_E). \tag{23}$$

By Equation 21, $$K(C|\tilde{C}) > K(C|\tilde{C}_E) \tag{24}$$

and $$K(\tilde{C}|C) > K(\tilde{C}_E|C). \tag{25}$$

Equation 24 means that the program that computes how to go from $\tilde{C}_E$ to C is shorter in length than the program that computes how to go from $\tilde{C}$ to C. Similarly, Equation 25 means that the program that computes how to go from C to $\tilde{C}_E$ is shorter in length than the program that computes how to go from C to $\tilde{C}$.

By Equation 24 and Equation 25, it follows that $$\max(K(C|\tilde{C}_E), K(\tilde{C}_E|C)) < \max(K(C|\tilde{C}), K(\tilde{C}|C)) \tag{26}$$

Therefore, by Equation 13 and Equation 22, $$\frac{\max(K(C|\tilde{C}_E), K(\tilde{C}_E|C))}{K(C)} < \frac{\max(K(C|\tilde{C}), K(\tilde{C}|C))}{K(C)} \Rightarrow \tag{27}$$

$$\frac{\max(K(C|\tilde{C}_E), K(\tilde{C}_E|C))}{\max(K(C), K(\tilde{C}_E))} < \frac{\max(K(C|\tilde{C}), K(\tilde{C}|C))}{\max(K(C), K(\tilde{C}))},$$

which results in $$D_I(C, \tilde{C}_E) < D_I(C, \tilde{C}). \tag{28}$$

The source code $\tilde{C}_E$ learned from Equation 16 is thus more general than the source code $\tilde{C}$ learned from $\vec{x}_S$.

Proof of Proposition 1. As the normalized information distance $D_I(C, \tilde{C}_E)$ is not effectively computable, it can be approximated for practical purposes by the normalized compression distance $$D_C(C, \tilde{C}_E) = \frac{Z(\{C, \tilde{C}_E\}) - \min(Z(C), Z(\tilde{C}_E))}{\max(Z(C), Z(\tilde{C}_E))}, \tag{29}$$

wherein Z is a real-world compressor. As $\mathbb{Z}_S^n \subseteq \mathbb{X}^n$, the source code $\tilde{C}_E$ learned from Equation 16 is a partial function of the target source code C, i.e., $$\tilde{C}_E: \mathbb{X}^n \mapsto \mathbb{A}. \tag{30}$$

The compressed size Z(C) of the target source code C is thus larger than that of the learned source code $\tilde{C}_E$:

$$Z(C) > Z(\tilde{C}_E). \tag{31}$$

The compressed size $Z(\{C, \tilde{C}_E\})$ of the concatenation $\{C, \tilde{C}_E\}$ is equal to Z(C) because Equation 30 holds:

$$Z(\{C, \tilde{C}_E\}) = Z(C). \tag{32}$$

As the generalization condition given in Equation 28 is not effectively computable, an equivalent effectively computable condition is useful for practical purposes. As $$D_I(C, \tilde{C}_E) < D_I(C, \tilde{C}) \Leftrightarrow D_C(C, \tilde{C}_E) < D_C(C, \tilde{C}) \tag{33}$$

for the purposes of generalization, the effectively computable condition $$\frac{Z(\{C, \tilde{C}_E\}) - \min(Z(C), Z(\tilde{C}_E))}{\max(Z(C), Z(\tilde{C}_E))} < \frac{Z(\{C, \tilde{C}\}) - \min(Z(C), Z(\tilde{C}))}{\max(Z(C), Z(\tilde{C}))} \Rightarrow \tag{34}$$

$$\frac{Z(C) - Z(\tilde{C}_E)}{Z(C)} < \frac{Z(C) - Z(\tilde{C})}{Z(C)} \Rightarrow Z(C) - Z(\tilde{C}_E) < Z(C) - Z(\tilde{C})$$

is equivalent to $$Z(\tilde{C}_E) > Z(\tilde{C}). \tag{35}$$

Proof of Proposition 2. Minimizing Equation 29 above over the learned source code $\tilde{C}_E$ is the effectively computable optimization problem for the generalization of $\tilde{C}_E$ with respect to C:

$$\min_{\tilde{C}_E} D_C(C, \tilde{C}_E) = \min_{\tilde{C}_E} \left( \frac{Z(\{C, \tilde{C}_E\}) - \min(Z(C), Z(\tilde{C}_E))}{\max(Z(C), Z(\tilde{C}_E))} \right) \tag{36}$$

-continued $$= \min_{\tilde{C}_E}\left(\frac{Z(C) - Z(\tilde{C}_E)}{Z(C)}\right)$$

$$= \min_{\tilde{C}_E}(Z(C) - Z(\tilde{C}_E))$$

$$= \min_{\tilde{C}_E}(-Z(\tilde{C}_E))$$

which is equivalent to $$\max_{\tilde{C}_E} Z(\tilde{C}_E). \tag{37}$$

Supplementary experimental information is now provided.

Figure 9:
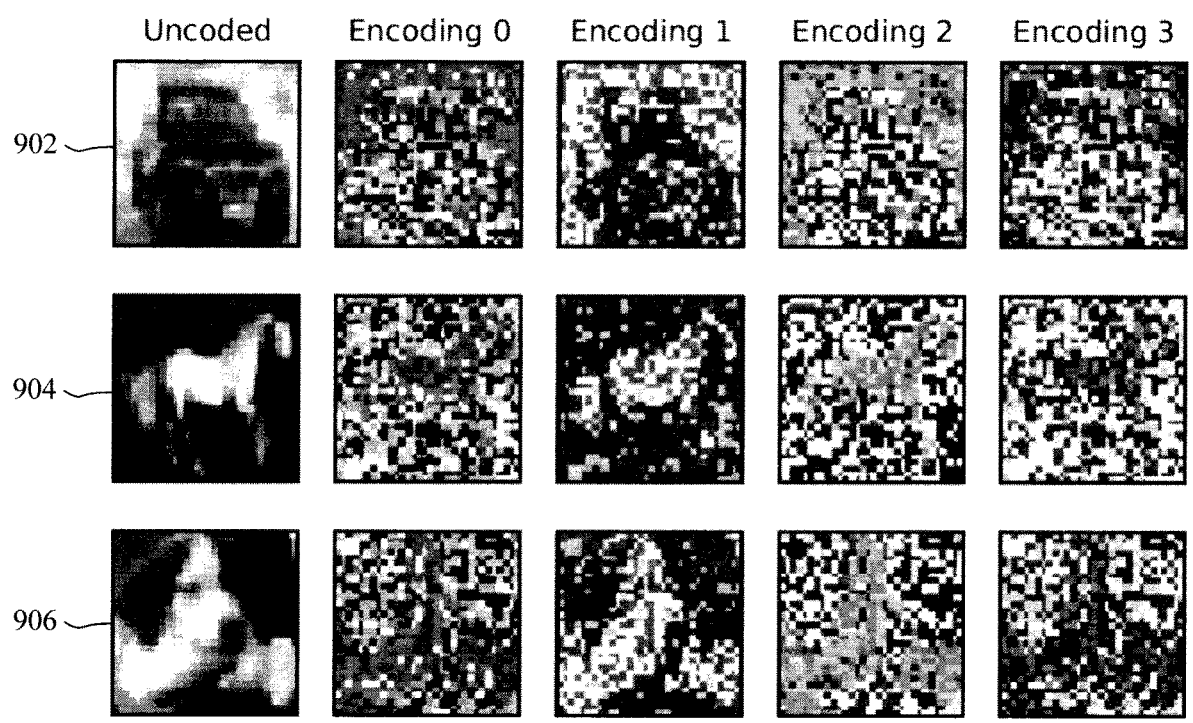
FIG. 9 is a diagram illustrating dataset II uncoded and encoded images according to an embodiment of the present invention.

Regarding the encoding scheme, FIG. 9 shows three dataset II (uncoded) images 902, 904 and 906 and four of their encodings (labeled "Encoding 0," "Encoding 1," "Encoding 2," and "Encoding 3"). Each encoding conveys a different view of the input features, which helps the learned source code to bear information about relations between the features that are contained in $\mathbb{X}^n$, but not in $\mathbb{X}_S^n$.

The channel-encoding method is not a data-augmentation technique: the encodings are appended to the input features, not treated as new samples. These encodings enable the classifier to learn from $\mathbb{X}_S^n$ a source code that is sufficiently complex for T. As in a data-transmission or data-storage system, the source code is designed for the most efficient representation of the data, which is $\mathbb{X}_S^n$ for T, and the channel code is independently designed for the channel. This combination is key to achieving generalization, and how best to design a channel code for T is an intriguing future research direction.

Regarding the training setup, the VGG networks are modified only by adding the encoder and increasing the number of input channels. The encoded models use the same training criterion as the uncoded models, namely the cross-entropy loss. All models are trained in PyTorch with 16 random initializations. The networks were trained over 450 epochs with a batch size of 128 and with a dynamic learning rate equal to 0.1 until epoch 150, 0.01 until epoch 250, and 0.001 until epoch 450. A test accuracy of 92.54% was achieved for the uncoded VGG-11 model, and 92.12%, 91.45%, and 90.19% for the VGG-11 model with 2, 8, and 32 encodings, respectively. The encoder outputs were normalized in the encoded VGG-16 models, where the standard deviation is multiplied by a scaling factor. A test accuracy of 94.15% was achieved for the uncoded VGG-16 model, and 91.11%, 88.93%, and 87.38% for the VGG-16 model with 2, 8, and 32 encodings with a scaling factor of 0.3, 0.4, and 0.08, respectively. A test accuracy of 85.71% was achieved for the VGG-16 model with 2 encodings with a scaling factor of 0.08. The uncoded ResNet-18 model, which is used for transfer attacks, achieves 95.20% test accuracy.

Additional Experiments are now described. The dataset I consists of the 10,000-sample dataset II test set subjected to five different noise levels, called severity, so it has 50,000 samples in all. For example, as shown in FIGS. 5A-5C, when test samples are subjected to impulse noise with a severity level of 4, a sharper increase in the number of test errors for the uncoded VGG model is seen than that for the VGG model with 32 encodings.

It is notable that the vertical axis in the plots using the dataset I is cumulative, i.e., the number of test errors made at the previous severity level is added to that at the current severity level. To show the robustness of the encoded VGG models to Gaussian noise beyond the noise levels included in the dataset I, Gaussian noise with zero mean and variance $\sigma_w^2$ was applied to the dataset II test set. The average input-feature energy equals $$\frac{1}{kn}\sum_{i=0}^{kn-1}\vec{x}_i^2, \tag{38}$$

where $\vec{x}_i$ is a feature of the input sample $\vec{x}$, k is the number of input samples in the test set, and n is the number of features in an input sample. The signal-to-noise ratio is defined to be $$\frac{1}{kn\sigma_w^2}\sum_{i=0}^{kn-1}\vec{x}_i^2. \tag{39}$$

Figures 10A, 10B:
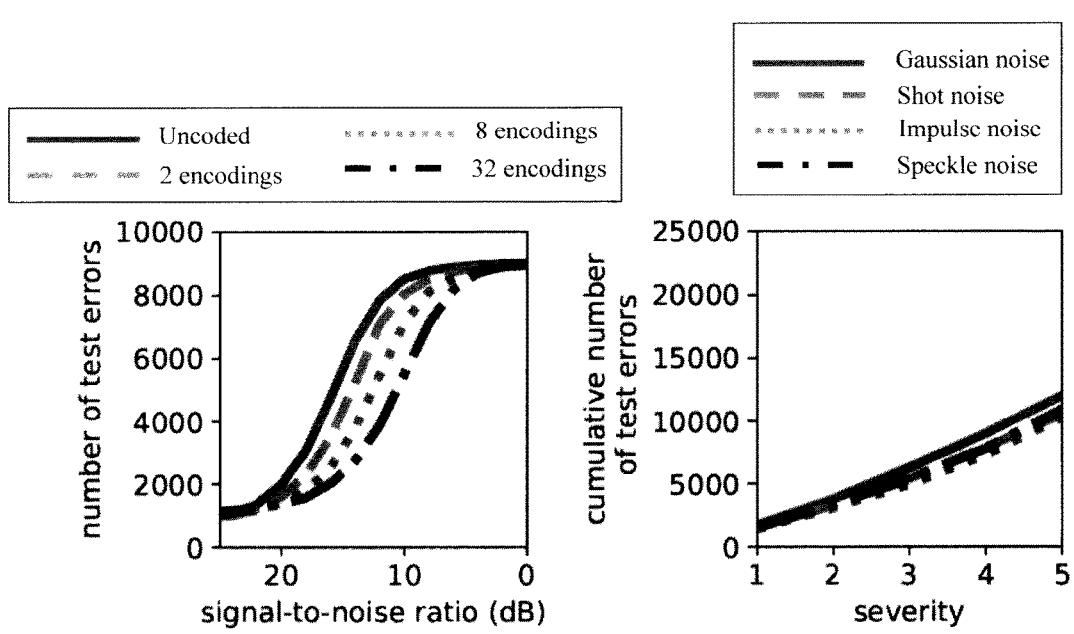
FIG. 10A is a diagram illustrating the uncoded VGG-11 model and encoded VGG-11 models tested on the dataset II test set corrupted by Gaussian noise according to an embodiment of the present invention.
FIG. 10B is a diagram illustrating the VGG-16 model with 32 encodings tested on the samples in the dataset I corrupted by Gaussian noise, shot noise, impulse noise, and speckle noise according to an embodiment of the present invention.

FIG. 10A illustrates that increasing the number of encodings concatenated to the input features significantly increases robustness to Gaussian noise applied to the dataset II test set with signal-to-noise ratios from 25 to 0 dB. For example, at a signal-to-noise ratio of 12 dB, the inference accuracy of the VGG-11 model with 32 encodings is 61:15%, whereas that of the uncoded VGG-11 model is 21:49%. In FIG. 10B, the experimental results for the VGG-16 model with 32 encodings tested on the samples in the dataset I corrupted by Gaussian noise, shot noise, impulse noise, and speckle noise are given. The results indicate that using a larger encoded model does not necessarily confer more robustness to such common corruptions as Gaussian noise and shot noise than a smaller encoded model.

Figures 11A, 11B:
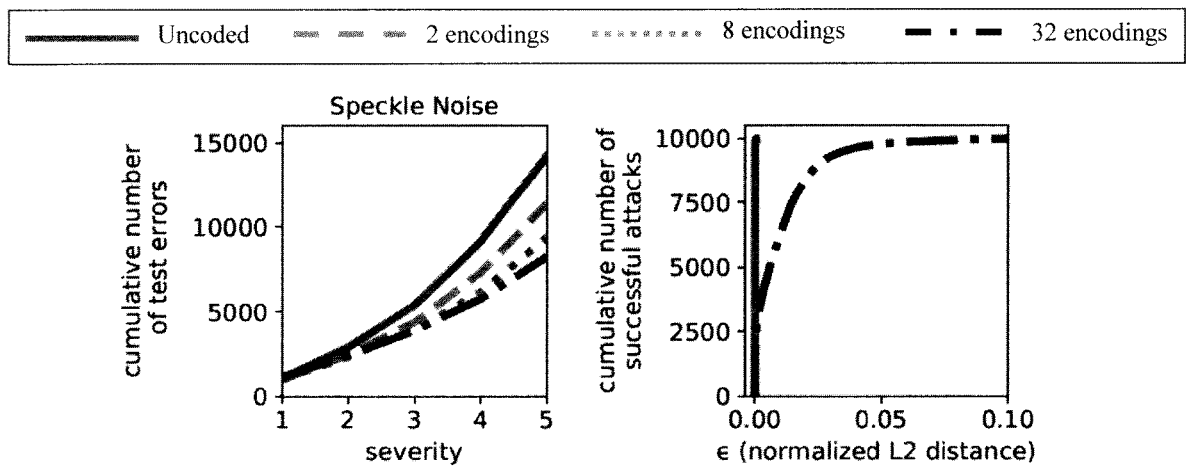
FIG. 11A is a diagram illustrating the uncoded VGG-11 model and encoded VGG-11 models tested on samples in the dataset I corrupted by speckle noise according to an embodiment of the present invention.
FIG. 11B is a diagram illustrating the uncoded VGG-16 model and encoded VGG-16 model tested on samples in the dataset II perturbed by the black-box boundary perturbation according to an embodiment of the present invention.

FIGS. 11A and 11B provide the results of the experiments conducted on the dataset I corrupted by speckle noise and black-box boundary perturbation experiments on the dataset II. As shown in FIG. 11A, as with the other type of common-corruption experiments, increasing the number of encodings increases robustness to speckle noise. As shown in FIG. 11B, the encoded model is significantly more robust to the black-box boundary attack than the uncoded model. For example, at a normalized '2 distance of 0:01, an inference accuracy of approximately 50% is achieved by the model with 32 encodings, whereas the inference accuracy of the uncoded model already drops to 0% at an $l_2$ distance much closer to 0.

Figures 12A, 12B, 13:
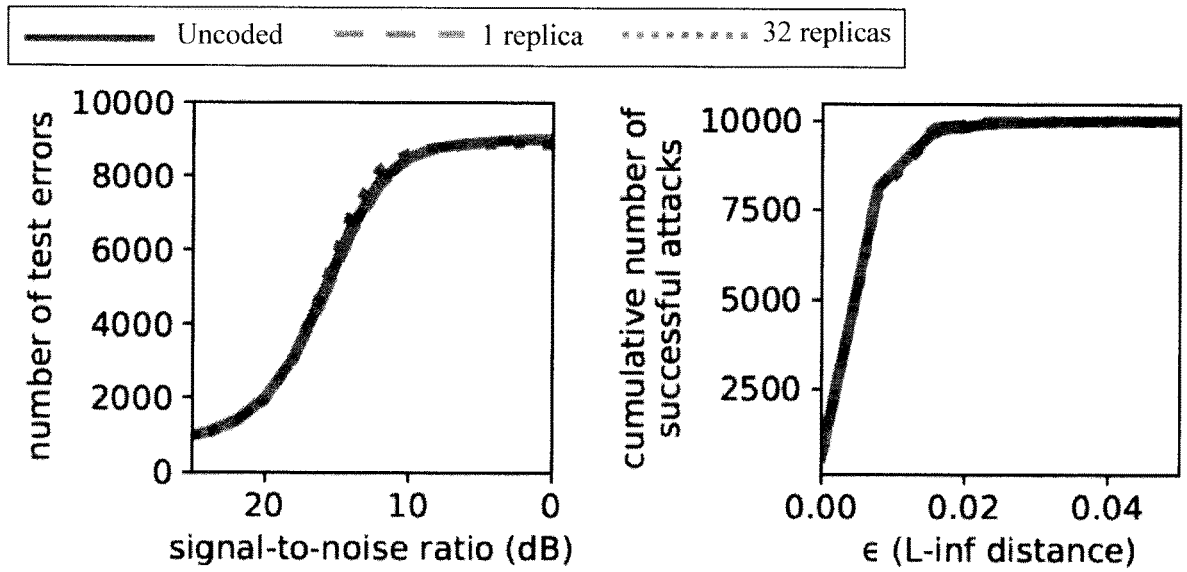
FIG. 12A is a diagram illustrating robustness to Gaussian noise tested by providing identical samples from the dataset II test set to an increased number of input channels according to an embodiment of the present invention.
FIG. 12B is a diagram illustrating robustness to PGD adversarial perturbations tested by providing identical samples from the dataset II test set to the increased number of input channels according to an embodiment of the present invention.
FIG. 13 is a diagram illustrating an exemplary symbol-to-bit mapping matrix according to an embodiment of the present invention.

Regarding the impact of increasing the number of input channels of a deep neural network (DNN) on its robustness, to study the impact of increasing the number of input channels of the uncoded VGG-11 and VGG-16 models, experiments were conducted on the encoded VGG-11 and VGG-16 models that use identical encodings, i.e., the input features are replicated across additional input channels, which means that the "encoders" are identity functions. As shown in FIG. 12A, increasing the number of input channels of the uncoded VGG-11 model confers no robustness to Gaussian noise whatsoever. As shown in FIG. 12B increasing the number of input channels of the uncoded VGG-16 model does not confer robustness to white-box PGD either.

Further details regarding the channel encoder provided in FIG. 4 (described above) are now provided. The features in the dataset II are represented by eight bits. According to an exemplary embodiment, the channel encoder flattens the input features by grouping them into 2×2 patches of features and then, starting from the upper left feature and ending at the lower left feature, ordering them in a sequence going in the clockwise direction. The features are traversed twice in order to avoid the initialization length of the channel code. This particular scheme is used because it focuses on local relations between features. It is notable that this technique is merely one exemplary, non-limiting flattening scheme that may be employed in accordance with the present techniques.

The flattened features are next fed to the convolutional encoder 402, which produces one extra bit out of the two least significant bits of the eight bits representing each feature. The 4-D 5-PAM TCM symbol mapper 404 then maps each nine bits into four equidistant 5-PAM symbols, which are then mapped to 12 bits by the bit mapper 406. The bit mapper 406 uses different symbol-to-bit mappings to generate different encodings of the input features. The matrix used for generating these encodings is described below. Notably, each encoding has the same size as the original input samples.

According to an exemplary embodiment, the bit mapper 406 uses the matrix 1300 in illustrated in FIG. 13 to map four 5-PAM symbols into 12 bits. In this symbol-to-bit mapping matrix 1300, the $i^{th}$ row corresponds to the encoding $E_i$, where $0 \leq i \leq 31$. Each symbol in the 5-PAM symbol alphabet is converted into three bits by using the corresponding three columns in this matrix 1300. For example, the first symbol in the 5-PAM symbol alphabet for the encoding $E_3$ is converted to [1 0 0] by drawing the bits from the third row and third, fourth, and fifth columns of the symbol-to-bit mapping matrix 1300. After all four of the 5-PAM symbols are converted into their respective three bits, these bits are concatenated to each other, determining the value of the corresponding feature in the encoded sample.

Regarding computing infrastructure and average run times, experiments were run using PyTorch on a computing cluster composed of x86-based servers with NVIDIA K40, K80, and V100 GPUs, and the experiments described above were run on single servers using up to 2 CPU cores and 2 GPU devices. 10 training epochs took 2 minutes 50 seconds for the uncoded VGG-16 model. When encodings were calculated in each epoch, i.e., when they were not calculated prior to training, 10 training epochs took 3 minutes 38 seconds, 4 minutes 15 seconds, and 6 minutes 38 seconds for the VGG-16 model with 2 encodings, 8 encodings, and 32 encodings, respectively.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 14:
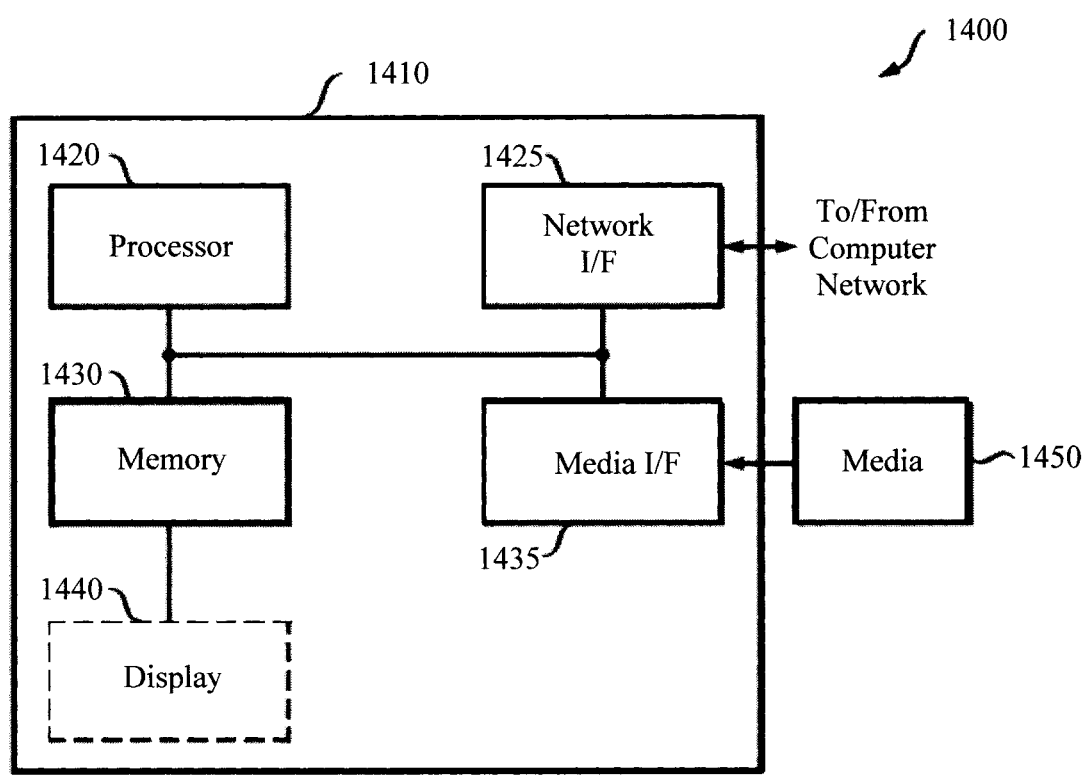
FIG. 14 is a diagram illustrating an exemplary apparatus for performing one or more of the methodologies presented herein according to an embodiment of the present invention.

Turning now to FIG. 14, a block diagram is shown of an apparatus 1400 for implementing one or more of the methodologies presented herein. By way of example only, apparatus 1400 can be configured to implement one or more of the steps of methodology 100 of FIG. 1. For instance, according to an exemplary embodiment, encoded model architecture 300 including base model 304, encoded model 306 and encoder 310 are embodied in apparatus 1400.

Apparatus 1400 includes a computer system 1410 and removable media 1450. Computer system 1410 includes a processor device 1420, a network interface 1425, a memory 1430, a media interface 1435 and an optional display 1440. Network interface 1425 allows computer system 1410 to connect to a network, while media interface 1435 allows computer system 1410 to interact with media, such as a hard drive or removable media 1450.

Processor device 1420 can be configured to implement the methods, steps, and functions disclosed herein. The memory 1430 could be distributed or local and the processor device 1420 could be distributed or singular. The memory 1430 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1420. With this definition, information on a network, accessible through network interface 1425, is still within memory 1430 because the processor device 1420 can retrieve the information from the network. It should be noted that each distributed processor that makes up processor device 1420 generally contains its own addressable memory space. It should also be noted that some or all of computer system 1410 can be incorporated into an application-specific or general-use integrated circuit.

Optional display 1440 is any type of display suitable for interacting with a human user of apparatus 1400. Generally, display 1440 is a computer monitor or other similar display.

Figure 15:
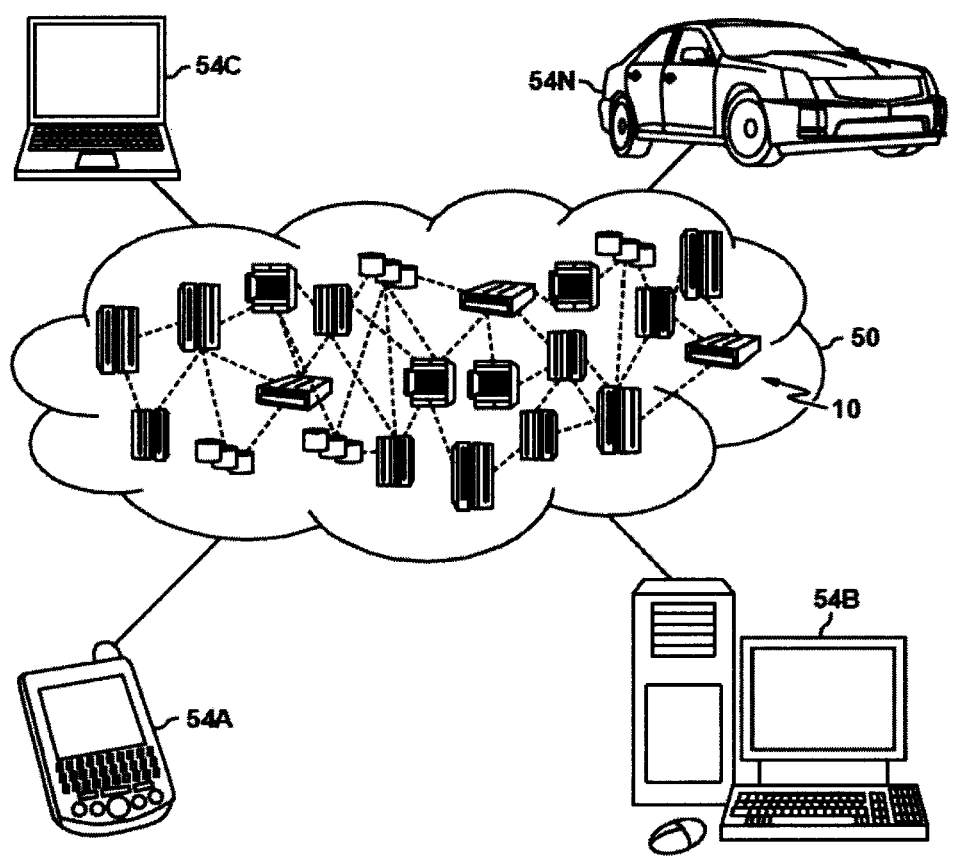
FIG. 15 depicts a cloud computing environment according to an embodiment of the present invention.
Figure 16:
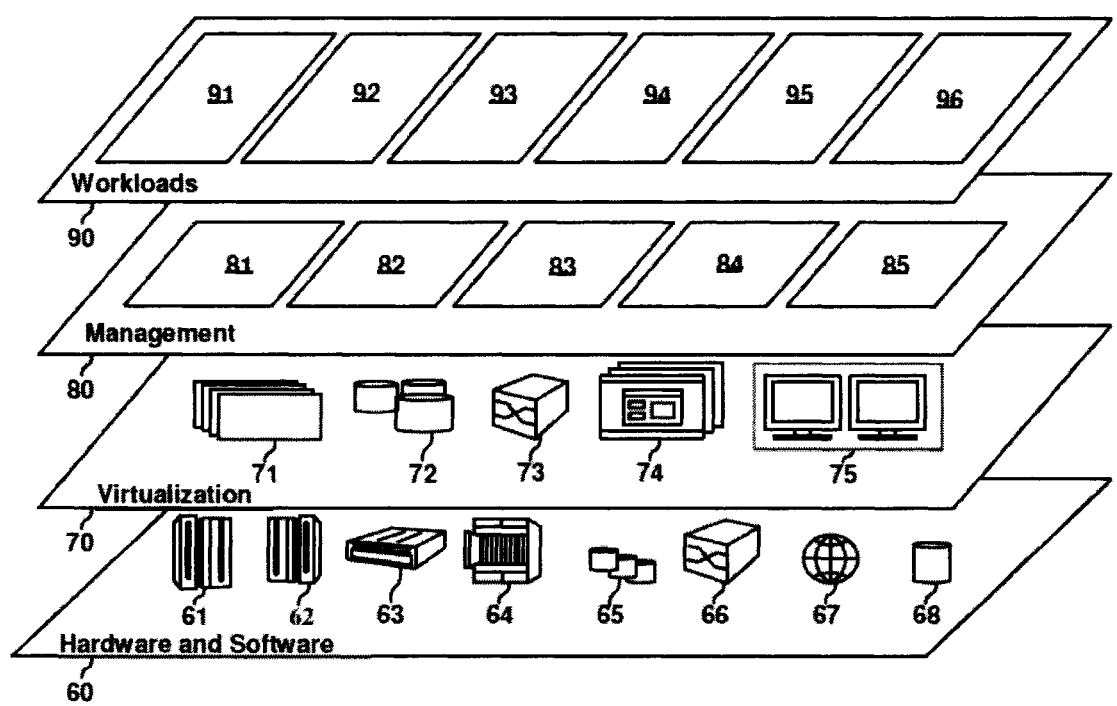
FIG. 16 depicts abstraction model layers according to an embodiment of the present invention.

Referring to FIG. 15 and FIG. 16, it is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 15, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 6 are intended to be illustrative only and that computing nodes 10 and cloud computing environment 50 can communicate with any type of computerized device over any type of network and/or network addressable connection (e.g., using a web browser).

Referring now to FIG. 16, a set of functional abstraction layers provided by cloud computing environment 50 (FIG. 15) is shown. It should be understood in advance that the components, layers, and functions shown in FIG. 16 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and classification generalization 96.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for classification generalization, the method comprising:

encoding original input features from at least one input sample $\vec{x}_S$ with a uniquely decodable code using an encoder $E(\bullet)$ to produce encoded input features $E(\vec{x}_S)$, wherein the at least one input sample $\vec{x}_S$ comprises uncoded input features, wherein encoding the original input features further comprises generating multiple encodings of the input features using a four-dimensional (4-D) five-level pulse-amplitude modulation (5-PAM) trellis-coded modulation (TCM) symbol mapper;

feeding the uncoded input features and the encoded input features $E(\vec{x}_S)$ to a base model to build an encoded model, wherein the encoded model comprises the encoder $E(\bullet)$ and the base model; and learning a classification function $\tilde{C}_E(\bullet)$ using the encoded model, wherein the classification function $\tilde{C}_E(\bullet)$ learned using the encoded model is more general than that learned using the uncoded input features alone.

2. The method of claim 1, further comprising:

learning, for a classification task T, a general suboptimal source code $\tilde{C}_E$ from concatenation $\{\vec{x}_S, E(\vec{x}_S)\}$, wherein the encoder $E(\bullet)$ is a concatenation of encodings $E_i: \mathbb{X}_S^n \to \mathbb{Y}_{S,i}^n$ of the input sample $\vec{x}_S$ such that $\mathbb{Y}_{S,i}^n \subseteq \mathbb{X}^n$ and $\mathbb{Y}_{S,i}^n \not\subseteq \mathbb{X}_S^n$, wherein the at least one input sample $\vec{x}_S$ is present in empirical sample set $\mathbb{X}^n$, wherein $\mathbb{X}_S^n$ is a subset of $\mathbb{X}^n$, and wherein $\mathbb{Y}_{S,i}^n$ is an encoding codomain.

3. The method of claim 1, wherein the at least one input sample comprises at least one digital image.

4. The method of claim 1, wherein each of the multiple encodings has a same size as the original input features.

5. The method of claim 1, further comprising:

stacking the uncoded input features and the encoded input features $E(\vec{x}_S)$.

6. The method of claim 1, further comprising:

increasing a number of input channels in the base model such that the base model has enough of the input channels to handle both the uncoded input features and the encoded input features $E(\vec{x}_S)$.

7. The method of claim 1, wherein the base model comprises a supervised learning algorithm.

8. The method of claim 7, wherein the supervised learning algorithm comprises a deep neural network.

9. The method of claim 1, wherein the original input features are an only input to the encoded model.

10. An apparatus comprising a processor, connected to a memory, operable to:

encode original input features from at least one input sample $\vec{x}_S$ with a uniquely decodable code using an encoder $E(\bullet)$ to produce encoded input features $E(\vec{x}_S)$, wherein the at least one input sample $\vec{x}_S$ comprises uncoded input features, wherein encoding the original input features further comprises generating multiple encodings of the input features using a four-dimensional (4-D) five-level pulse-amplitude modulation (5-PAM) trellis-coded modulation (TCM) symbol mapper, wherein each of the multiple encodings has a same size as the original input features;

feed the uncoded input features and the encoded input features $E(\vec{x}_S)$ to a base model to build an encoded model, wherein the encoded model comprises the encoder $E(\bullet)$ and the base model, and wherein the original input features are an only input to the encoded model; and learn a classification function $\tilde{C}_E(\bullet)$ using the encoded model, wherein the classification function $\tilde{C}_E(\bullet)$ learned using the encoded model is more general than that learned using the uncoded input features alone.

11. The apparatus of claim 10, wherein the processor is further operable to:

learn, for a classification task T, a general suboptimal source code $\tilde{C}_E$ from concatenation $\{\vec{x}_S, E(\vec{x}_S)\}$, wherein the encoder $E(\bullet)$ is a concatenation of encodings $E_i: \mathbb{X}_S^n \to \mathbb{Y}_{S,i}^n$ of the input sample $\vec{x}_S$ such that $\mathbb{Y}_{S,i}^n \subseteq \mathbb{X}^n$ and $\mathbb{Y}_{S,i}^n \not\subseteq \mathbb{X}_S^n$, wherein the at least one input sample $\vec{x}_S$ is present in empirical sample set $\mathbb{X}^n$, wherein $\mathbb{X}_S^n$ is a subset of $\mathbb{X}^n$, and wherein $\mathbb{X}_{S,i}^n$ is an encoding codomain.

12. The apparatus of claim 10, wherein the processor is further operable to:

increase a number of input channels in the base model such that the base model has enough of the input channels to handle both the uncoded input features and the encoded input features $E(\vec{x}_S)$.

13. A non-transitory computer program product for classification generalization, the computer program product comprising a computer readable storage medium having program instructions embodied therewith, the program instructions executable by a computer to cause the computer to:

encode original input features from at least one input sample $\vec{x}_S$ with a uniquely decodable code using an encoder $E(\bullet)$ to produce encoded input features $E(\vec{x}_S)$ wherein the at least one input sample $\vec{x}_S$ comprises uncoded input features, wherein encoding the original input features further comprises generating multiple encodings of the input features using a four-dimensional (4-D) five-level pulse-amplitude modulation (5-PAM) trellis-coded modulation (TCM) symbol mapper, wherein each of the multiple encodings has a same size as the original input features;

feed the uncoded input features and the encoded input features $E(\vec{x}_S)$ to a base model to build an encoded model, wherein the encoded model comprises the encoder $E(\bullet)$ and the base model, and wherein the original input features are an only input to the encoded model; and learn a classification function $\tilde{C}_E(\bullet)$ using the encoded model, wherein the classification function $\tilde{C}_E(\bullet)$ learned using the encoded model is more general than that learned using the uncoded input features alone.

14. The non-transitory computer program product of claim 13, wherein the program instructions further cause the computer to:

learn, for a classification task T, a general suboptimal source code $\tilde{C}_E$ from concatenation $\{\vec{x}_S, E(\vec{x}_S)\}$, wherein the encoder $E(\bullet)$ is a concatenation of encodings $E_i: \mathbb{X}_S^n \to \mathbb{Y}_{S,i}^n$ of the input sample $\vec{x}_S$ such that $\mathbb{Y}_{S,i}^n \subseteq \mathbb{X}^n$ and $\mathbb{Y}_{S,i}^n \not\subseteq \mathbb{X}_S^n$, wherein the at least one input sample $\vec{x}_S$ is present in empirical sample set $\mathbb{X}^n$, wherein $\mathbb{X}_S^n$ is a subset of $\mathbb{X}^n$, and wherein $\mathbb{Y}_{S,i}^n$ is an encoding codomain.

* * * * *